United States Patent
Kuga et al.

(10) Patent No.: US 8,558,533 B2
(45) Date of Patent: Oct. 15, 2013

(54) PASSIVE INTERMODULATION DISTORTION MEASURING METHOD AND SYSTEM

(75) Inventors: Nobuhiro Kuga, Yokohama (JP); Yasuyuki Yamamoto, Yokohama (JP)

(73) Assignee: Yokohama National University, Yokohama-shi (JP)

( * ) Notice: Subject to any disclaimer, the term of this patent is extended or adjusted under 35 U.S.C. 154(b) by 697 days.

(21) Appl. No.: 12/377,524

(22) PCT Filed: Feb. 23, 2007

(86) PCT No.: PCT/JP2007/053438
§ 371 (c)(1), (2), (4) Date: Jul. 29, 2010

(87) PCT Pub. No.: WO2008/029522
PCT Pub. Date: Mar. 13, 2008

(65) Prior Publication Data
US 2010/0295533 A1 Nov. 25, 2010

(30) Foreign Application Priority Data
Sep. 6, 2006 (JP) ................................ 2006-241821

(51) Int. Cl.
*G01R 23/02* (2006.01)

(52) U.S. Cl.
USPC ...................................................... 324/76.39

(58) Field of Classification Search
USPC ...................................................... 324/76.39
See application file for complete search history.

(56) References Cited

U.S. PATENT DOCUMENTS 5,735,695 A * 4/1998 Heinrich .......................... 439/63
6,847,267 B2 * 1/2005 Flake et al. ...................... 333/20
2003/0156001 A1 * 8/2003 Echols, Jr. ..................... 336/155

FOREIGN PATENT DOCUMENTS

| CA | 744833 A | 10/1966 |
| JP | 40-24117 B | 10/1965 |
| JP | 62-151766 A | 7/1987 |
| JP | 64-054273 U | 3/1989 |
| JP | 01-172738 A | 7/1989 |

(Continued)

OTHER PUBLICATIONS

Kagiwada et al., "A Simple Method for Measuring a Complex Permittivity of Powders using Standing Wave Method on a Rectangular Waveguide," IEICE Technical Report, vol. 100, No. 8, pp. 49-54, 2000.

(Continued)

*Primary Examiner* — Jeff Natalini
(74) *Attorney, Agent, or Firm* — Venable LLP; Michael A. Sartori; Tamatane J. Aga

(57) ABSTRACT

According to a reception passive intermodulation measurement method of the present invention, a device under test is set to the mismatching condition, and a standing wave is generated on a transmission line where the sample is connected. Since the tip of the transmission line is short-circuited using the sample, the sample is positioned at the anti-node of the standing wave, and test signals are applied at a high current density. System noise is calibrated with the tip of the transmission line being open. Since impedance matching is not required and terminators are not employed, a large measurement dynamic range is obtained without being affected by passive intermodulation that is generated in terminators. The sample is very small, and an arbitrary shape can be selected. The property measurement is enabled for a wide range of materials, regardless of a conductive material, an insulating material and a magnetic material.

6 Claims, 26 Drawing Sheets

(56) References Cited

FOREIGN PATENT DOCUMENTS

| JP | 02-110357 A | 4/1990 |
|---|---|---|
| JP | 05-157784 A | 6/1993 |
| JP | 7-86481 | 9/1995 |
| JP | 9-43165 | 2/1997 |
| JP | 2004-294124 A | 10/2004 |
| JP | 2005-121494 | 5/2005 |
| JP | 2006-196621 A | 7/2006 |

OTHER PUBLICATIONS

Kuga et al., "PIM Characateristics evaluation of dielectric substrates by using microstrip line," IEICE Technical Report, vol. 104, No. 206, pp. 97-101, 2004.

Minowa et al., "Application of two frequency non-linearity measuring method to contacts", IEICE Trans.C, vol. J85-C, No. 11, pp. 917-924, Nov. 1985.

Kuga et al., "PIM characteristics of copper-clad dielectric substrates evaluated by using microstrip lines", IEICE Trans-C, vol. J88-B, No. 4, pp. 847-852, Apr. 2005.

Yamamoto et al., "PIM evaluation for conductor resistance in microstrip line", IEICE Electronics Society Convention Rec. C-5-1, 1 page, Sep. 7, 2005.

Yamamoto et al., "A short-circuit transmission line method for PIM evaluation of metallic materials", IEICE Technical Report, vol. 106, No. 130, pp. 57-61, Jun. 23, 2006.

Yamamoto et al., "PIM evaluation for conductive wire by using shorted coaxial line", IEICE Conference Report, C-5-6, 1 page, Jun. 23, 2006.

Yamamoto et al., "Short-circuit transmission line method for PIM evaluation of metallic materials", IEEE Transactions on Electromagnetic Compatibility, vol. 49, No. 3, pp. 682-688. Aug. 2007.

Kuga et al., "Non-contact PIM measurement method for electrical connection inspection", IEEE Asian Pacific Microwave Conference, 4 pages, APMC 2007.

Office Action in Japanese Patent Application No. 2011-246557, dated Aug. 6, 2013.

\* cited by examiner

PASSIVE INTERMODULATION DISTORTION MEASURING METHOD AND SYSTEM

TECHNICAL FIELD

The present invention relates to a measurement method and a measurement system for an electric material, a magnetic material, etc., in a high frequency band. More specifically, the present invention relates to a method for employing passive intermodulation to measure an electromagnetic characteristic of an electric material, a magnetic material, etc., and a measurement system therefore.

BACKGROUND ART

Intermodulation is one of the phenomena that become problems in a broad frequency band for apparatuses, including an electronic apparatus operating in a low-frequency audio band and a wireless communication apparatus. Generally, intermodulation is generated as a distortion signal of a new frequency component when a low frequency electronic apparatus, a wireless communication apparatus or a semiconductor device receives or outputs a plurality of signals of different, but similar frequencies. In a low frequency band, for example, an analysis is performed based on contact, non-linear distortion (see non-patent document 1). Further, because of requests for an increase in frequency and efficiency, and for a decrease in distortion for a wireless communication apparatus, a reduction in intermodulation has also been studied for a high frequency band. These intermodulation problems have been regarded as matters related to the nonlinearity of active components, such as an amplifier and a semiconductor device employed in the apparatus.

Relevant to the above described intermodulation, a new problem is focused on: passive intermodulation. In this specification, hereinafter, passive intermodulation is simply called PIM. Unlike the conventional intermodulation problem that occurs in active components, PIM occurs in passive circuits and passive components. It is known that PIM usually occurs at a metal contact point for different types, or for a like type, of metals due to a potential difference of the metals and a nonlinear, lumped resistance.

FIGS. 12A and 12B are diagrams for explaining the concept of PIM. PIM is a distortion signal that is generated, as is conventional intermodulation, at a time whereat two signals with similar frequencies are transmitted to an object to be measured. In FIG. 12A are shown PIM signals (f3, f5, f7, . . . ) that are generated when a test signal having a frequency f1 and a test signal having a frequency f2 are input to an object to be tested. According to this relationship, the odd-number order PIM signal appears around the two test signals, and in accordance with an increase in the number order, distortion is located in a frequency distant from the test signals. Further, in a case wherein the frequencies f1 and f2 are distant from each other, an even-number order PIM signal would become the cause of a poor reception. Generally, the PIM generation level is lower as the order number becomes greater. For simplification, only PIMs on the higher frequency side from the test signals are shown in FIG. 12A. Even in a case wherein test signals having a power level of +43 dBm are input, the generation level for PIM signals is very low, i.e., about −50 to −150 dBm. This level is very low, compared with intermodulation distortion that is a problem for an active component. However, a wireless communication apparatus that handles low level signals can not ignore this PIM.

FIG. 12B is a diagram for explaining why a PIM constitutes a communication outage. FIG. 12B shows a frequency relationship between two separated frequency bands, i.e., a transmission frequency band (Tx) and a reception frequency band (Rx), for a wireless communication system of a frequency division duplex method. For example, in a case for the base station of a mobile phone system, two signals of frequencies f1 and f2 are simultaneously transmitted in the transmission band Tx of the base station. At this time, a PIM signal of a frequency f3 is generated, for example, by a passive component, such as a transmission filter, provided in the base station transmitter and an antenna. This PIM signal falls, via a transmission/reception antenna, into the reception band Rx of the base station. In such a case, the PIM signal becomes a disturbance factor for a signal received at the same frequency f3, and a communication outage occurs.

Recently, PIMs generated in passive component materials become conspicuous, especially due to a high-frequency and high-power operation, a multicarrier technology and a broad band modulation in wireless communications. Formerly, it was considered that PIMs occurred as a result of metal potential differences and nonlinear resistance at contact point portions of passive components. However, a new focus has been drawn to the fact that PIMs occur in states wherein nonlinear lumped resistance or different types of metals are not present, e.g., a PIM that occurs in a metallic material such as is used for a printed board circuit.

FIG. 13A is a diagram for explaining a PIM that occurs at a contact point portion. An antenna 124 portion of a wireless equipment (e.g., a mobile phone system), which employs a frequency division duplex system, is employed as an example. An antenna duplexer (hereinafter referred to as a DUP) 120, which separates a transmission signal from a reception signal, is employed to share as both a transmission antenna and a reception antenna. The DUP 120 accommodates a transmission terminal 121, to which a transmission circuit is connected, a reception terminal 122, which is connected to a reception circuit, and an antenna terminal 123, which is connected to an antenna 124. When two transmission signals having different frequencies are transmitted by the transmission circuit to the DUP 120, a PIM signal 125a and a PIM signal 125b are generated at the connector contact points of the transmission terminal 121 and the antenna terminal 123.

FIG. 13B is a diagram for explaining a PIM generated in a material of a passive component. A PIM is still observed in a case wherein a plan circuit, such as a microstrip line (hereinafter referred to as an MSL), is employed for connections made to the DUP 120, instead of connectors being used that require contact points. It is assumed that the PIM is generated in a plan circuit 126a, such as an MSL and a phase shifter that are provided for the antenna 124, or a plan circuit, such as an MSL 126b that is mounted on the printed circuit board of the wireless equipment. It is also assumed that the PIM is generated in a conductive material and a dielectric material that constitute the MSL. Non-patent document 2, submitted by the present inventors, also discloses information relative to the evaluation results, obtained by a PIM measurement performed using the MSL, for the PIM that, itself, is generated in a metallic material.

FIG. 14 is a diagram illustrating a conventional PIM measurement system for a high frequency band. The arrangement of the PIM measurement system described, for example, in non-patent document 2 can be roughly divided into a section for generating a test signal, and a section for separating/detecting a PIM and an object to be tested. Test signals, for different frequencies f1 and f2, are generated by signal generation units 101 and 102. The electric power levels of the test signals must be sufficient for the generation of a PIM in a DUT. As an example, there is a case wherein a signal generator is employed that can output signals, each of which has a power of +43 dBm (20 W) or higher. The signal generation units 101 and 102 generally include a signal generator (SG) and an A class power amplifier.

The test signals transmitted by the two signal generation units 101 and 102 are combined by a coupler 103, and the obtained signal is transmitted to the transmission terminal of a DUP 107. The test signals for two frequencies, output by the antenna terminal of the DUP 107, are transmitted to one end of a sample to be measured (hereinafter referred to as a device under test (DUT)) 104. The other end of the DUT 104 is connected to a terminator 105. The test signals are terminated by the terminator 105. The terminator 105 is employed so that the impedance of the entire PIM measurement system matches a characteristic impedance of 50Ω, for absorbing a test signal, and the performance of the measurement is stabilized without generating an unwanted reflection wave around the DUT 104. According to this conventional PIM measurement method, fundamentally, the impedance of the entire measurement system is to be controlled at 50Ω, and the test signal for a high power level is to be passed through the DUT 104 and be absorbed by the terminator 105.

The PIM signal generated in the sample DUT 104 is transmitted to the antenna terminal of the DUP 107. The PIM signal is limited in the reception frequency band by the filter in the DUP 107, and the PIM signal is passed through the reception terminal and is measured as a PIM signal having the frequency f3, by a PIM measurement unit 106. The PIM measurement unit 106 includes, for example, a low noise amplifier and a spectrum analyzer. As is well known by one having ordinary skill in the art, the DUP 107 has a function for separating a transmission signal and a reception signal, and the operation thereof will not be given.

The above described conventional PIM measurement method, however, has the following problems, and is not a satisfactory method. The first problem is that the physical structure of a DUT is limited. For example, for a DUT that is disclosed in non-patent document 2 and that is employed for the PIM measurement using the MSL, a plane circuit that includes a metallic electrode material and a dielectric substrate material, for which the measurement is to be performed, must be prepared.

FIG. 15 is a diagram illustrating the structure of a measurement sample employed in a case wherein a PIM for an MSL is to be measured. As a measurement sample DUT 104, an MSL 113, comprising a copper foil conductor having a width W and a thickness t, is formed on the upper face of a dielectric substrate 112 having a width Ws, a length Ls, a thickness h and a dielectric constant $\in_r$. The opposite face of the MSL 113 is a ground plane made of the same copper foil as the MSL. Further, the two ends of the MSL 113 are connected to semi-rigid cables 110 and 111 that connect the DUT 104 to the DUP and the terminator. As previously described for the conventional PIM measurement method, the DUT 104 must be prepared to obtain an impedance match for a characteristic impedance of 50 Ω.

In a case wherein a transmission line is to be formed using the MSL, generally, the characteristic impedance of the line is determined based on the thickness h, the dielectric constant $\in_r$, for the dielectric board 112, and the width W and the conductor thickness t of the line conductor 113. In a case wherein one parameter is changed, the other parameter must also be changed in order to maintain a constant value for the characteristic impedance. Therefore, in a case involving an evaluation of the relationship of the generation of the PIM to the individual transmission line parameters described above, it is difficult for only a single parameter to be independently controlled.

A second problem is a PIM that occurs at a terminator, which is required to absorb the electric power of a test signal passed through the DUT. In the conventional PIM measurement system shown in FIG. 14, a PIM signal 108b is also generated by the terminator 105. The PIM measurement unit 106 then measures the resultant signal where the PIM signal 108a, which results from the sample in the DUT 104, and the PIM signal 108b, which results from the terminator 105, interfere with each other. At this time, when the level of the PIM generated at the terminator 105 is high, the measurement dynamic range for the PIM generated at the DUT is limited. The actual PIM generation level for the terminator is about −70 dBm, for example, for a common terminator that employs a resistor. Even for a terminator that includes a very long transmission line (e.g., a semi-rigid line of about 100 m) employing an appropriate transmission line loss with an open end, the PIM level is about −120 dBm. Therefore, when a special terminator is not prepared, PIM measurement at a low level is difficult, and it is hard for obtaining a wide dynamic range for a measurement system. In addition, since a connector contact point is included for the connection of the DUT 104 and the terminator 105, a PIM generated at the connector contact point is an element that makes the measurement uncertain. Therefore, considerable attention must be paid to the uncertain element in the measurement system. As described above, for a conventional PIM measurement system that assumes impedance matching condition, it is difficult for a large dynamic range to be stably obtained to perform a measurement.

As a problem that derives from the limitation on the structure of the above measurement sample, influence resulting from the size of the sample can not be ignored. A DUT must to some degree be large because of the manufacture of the DUT and the handling thereof. Further, the semi-rigid cables 110 and 111 must be connected to the two ends of the DUT 104 to obtain matching of the characteristic impedance of 50Ω for the signal source and the terminator. Therefore, even a small DUT is several cm or larger in size. Since the MSL structure is a distributed constant circuit model, a PIM is not generated at one concentrated point on the MSL, but is accumulated in a distributed manner. Therefore, the PIM level measured by the PIM measurement unit 106 varies, depending on the length Ls of the MSL.

Furthermore, in a case wherein a plurality of PIM generation sources are locally present on the MSL, PIM signals produced by these PIM generation sources interfere with each other. As a result of this interference, the PIM level observed could be changed in accordance with the MSL length. In addition, nonlinearity at the contact point of the connectors and the soldering point of the above described cables is also an obstacle to obtaining a precise PIM evaluation using the sample. Moreover, the processing of the DUT is troublesome, and in a conventional PIM measurement system that assumes the performance of impedance matching condition using the terminator, it is difficult for a precise PIM measurement, for a conductive material, etc., to be performed.

One objective of the present invention is to provide a method whereby the operational influence of a matching terminator is removed and the highly sensitive detection of a PIM is enabled by employing a DUT, for which there are extremely few limitations in size and shape, and a measurement system therefor. The current density for generating a PIM can be easily quantified, and property evaluations can be performed not only for a metallic material, but also for other materials, like an electric material such as a dielectric or a magnet, and a magnetic material. In addition, the PIM measurement method of the present invention can be applied for a defective detection method for electronic devices.

Non-patent document 1: "Application of nonlinearity measuring method using two frequencies for contacts", Isao Minowa, et. al., IEICE Transactions on Electronics, Vol. J85-C No. 11, pp. 91-924, November, 1985 Non-patent document 2: "PIM generated in dielectric circuit board that employs microstrip line", Nobuhiro Kuga, et. al., IEICE Transactions on Communications, Vol. J88-B No. 4, pp. 847-852, April 2005

DISCLOSURE OF THE INVENTION

According to a first embodiment of the present invention, a system for measuring a PIM signal, which is generated by a device under test in a high frequency band, comprising:

a plurality of signal generation means for generating a plurality of test signals, each having different frequencies;

signal separation means including a first terminal, used to input the plurality of test signals from the plurality of signal generation means, a second terminal, used to output the plurality of test signals received at the first terminal and to input the PIM signal, and a third terminal used to output only the PIM signal;

a transmission line, one end of which is connected to the second terminal of the signal separation means, and which provides an impedance mismatching condition between a device under test and the transmission line, and generates a standing wave of the plurality of test signals along the transmission line, while the device under test is located between two conductors along the transmission line where the standing wave is generated, or at the other end of the transmission line; and passive intermodulation measurement means connected to the third terminal of the signal separation means to measure the passive intermodulation signal.

According to a second embodiment of the present invention, a system for measuring a passive intermodulation signal, which is generated by a device under test in a high frequency band, comprising:

a plurality of signal generation means for generating a plurality of test signals, each having different frequencies;

signal separation means including a first terminal, used to input the plurality of test signals from the plurality of signal generation means, a second terminal, used to output the plurality of test signals received at the first terminal and to input the passive intermodulation signal, and a third terminal used to output only the passive intermodulation signal;

a conductive box, which is connected to the second terminal, via an opening, and in which the device under test is located under a standing wave of the plurality of test signals generated inside the conductive box; and passive intermodulation measurement means connected to the third terminal of the signal separation means to measure the passive intermodulation signal.

According to a third embodiment of the present invention, a system for measuring a passive intermodulation signal, which is generated by a device under test in a high frequency band, comprising:

a plurality of signal generation means for generating a plurality of test signals, each having different frequencies;

signal separation means including a first terminal, used to input the plurality of test signals from the plurality of signal generation means, a second terminal, used to output the plurality of test signals received at the first terminal and to input the passive intermodulation signal, and a third terminal used to output only the passive intermodulation signal;

a coaxial line, one end of which is connected to the second terminal of the signal separation means and from the other end of which the test signals are emitted, and which detects a passive intermodulation signal generated by the device under test due to the test signals; and passive intermodulation measurement means connected to the third terminal of the signal separation means to measure the passive intermodulation signal.

According to a fourth embodiment of the present invention, a system for measuring a passive intermodulation signal, which is generated by a device under test in a high frequency band, comprising:

a plurality of signal generation means for generating a plurality of test signals, each having different frequencies;

signal separation means including a first terminal, used to input the plurality of test signals from the plurality of signal generation means, a second terminal, used to output the plurality of test signals received at the first terminal and to input the passive intermodulation signal, and a third terminal used to output only the passive intermodulation signal;

a planar antenna that includes a planar radiator, which is connected at one end to the second terminal of the signal separation means and by which test signals are emitted to a device under test that is located in a near field being affected by a phase of an electromagnetic wave radiated by the planar antenna, and that detects a passive intermodulation signal generated by the device under test due to the test signals; and passive intermodulation measurement means connected to the third terminal of the signal separation means to measure the passive intermodulation signal.

BEST MODES FOR CARRYING OUT THE INVENTION

Preferred embodiments of the present invention will now be described in detail while referring to drawings.

First Embodiment

A PIM measurement method of a first embodiment is characterized in that a mismatching condition is provided between a transmission line, to which test signals are input, and a DUT, and a standing wave caused by mismatching is employed to measure a PIM signal that is generated by the DUT.

Figure 1:
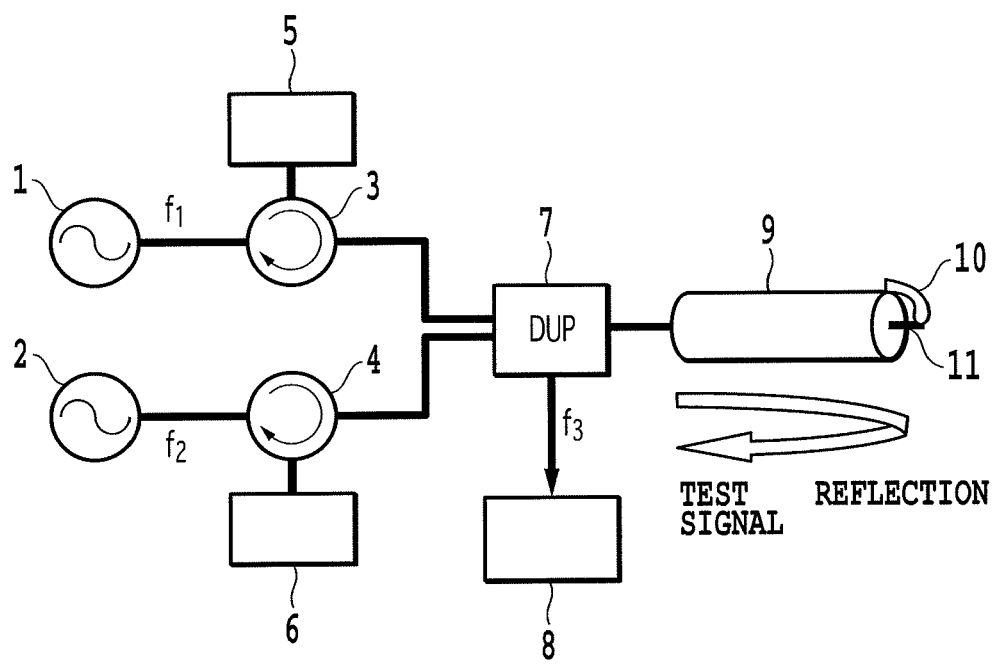
FIG. 1 is a diagram illustrating the arrangement of a measurement system employing a PIM measurement method according to a first embodiment of the present invention.

FIG. 1 is a diagram illustrating the arrangement of a measurement system used for the PIM measurement method according to the first embodiment of the present invention. The measurement system in FIG. 1 includes a section for generating a plurality of test signals and for terminating test signals that are reflected, a section for separating and detecting a PIM signal, and a transmission line section that includes a DUT. Test signals having different frequencies $f_1$ and $f_2$ are respectively output by test signal generation units 1 and 2. The test signal generation units 1 and 2 are, specifically, constituted by signal generators (SG), A-class amplifiers, etc. The test signal generation units 1 and 2 are respectively connected to circulators 3 and 4. The output terminals of the circulators 3 and 4 are connected to the separate transmission terminals of a DUP 7. Terminators 5 and 6 are respectively connected to the other terminals of the circulators 3 and 4. An arbitrary type of DUP 7 can be employed, so long as the DUP 7 passes two test signals, received at the first terminals (transmission terminals), only to a second terminal (antenna terminal), to which a DUT is connected, and allows only a PIM signal to pass from the second terminal (antenna terminal) to a third terminal (reception terminal). When appropriate frequencies are selected for the two test signals, a conventional antenna DUP for a mobile phone system, for example, can be employed.

A transmission line 9 is connected to the antenna terminal of the DUP 7. A two-conductor type transmission line, such as a coaxial cable, a coaxial line or a Lecher line, can be employed as the transmission line 9. For example, a UT141 semi-rigid cable, for which the center conductor is silver-plated, can be employed; however, the transmission line 9 is not limited to this. The tip of the transmission line 9 is short-circuited by a DUT 10. That is, the tips of the DUT 10 and the transmission line 9 are connected, for example, by soldering. A PIM measurement unit 8 is connected to the reception terminal, which is the other terminal of the DUP 7. The PIM measurement unit 8 is constituted, for example, by a low-noise amplifier and a spectrum analyzer.

The operation of the PIM measurement system of the first embodiment will now be described. The individual, two test signals output by the test signal generation units 1 and 2 are transmitted via the circulators 3 and 4 to the DUP 7. The circulators 3 and 4 prevent the two test signals from interfering with each other, and inhibit the generation of an intermodulation signal at the output for the test signals. Further, as will be described later in detail, when test signals that are fully reflected at the DUT 10 and are returned to the test signal generation units 1 and 2, these test signals are terminated by the terminators 5 and 6. Even when PIM is generated at the terminators 5 and 6, PIM signals produced in the terminators 5 and 6 are passed through the DUP 7 to be observed by the PIM measurement unit 8. Since the filter in the DUP 7 has a band elimination characteristic for a direction from the transmission terminal to the reception terminal, the PIM signals received from the terminators 5 and 6 are properly attenuated, and do not actually affect the PIM measurement performed in a direction leading from the DUT 10.

The feature of the PIM measurement method in the first embodiment is the structure of the DUT and the transmission line and the matching condition of test signals. The tip of the transmission line 9 is short-circuited using the DUT 10. A DUT that will be described later in detail can, for example, be a fine metal line for which a PIM evaluation is to be performed. When the tip of the transmission line is connected using the fine metal line, the transmission line with the short-circuited tip is connected to the antenna terminal of the DUP 7. According to a conventional PIM measurement method, characteristic impedance matching of 50 Ω is obtained for a DUT, and test signals are passed through the DUT and are absorbed by terminators. On the other hand, the PIM measurement method of the first embodiment is greatly different, in that impedance matching is not obtained for a DUT and a transmission line, and test signals are reflected at the DUT. Since short-circuiting of the end of the transmission line is simply performed using the DUT, terminators are not required on the DUT side. When the two test signals are fully reflected at the DUT, the test signals enter the DUP 7 from the antenna terminal and return to the transmission terminal. Further, the test signals are passed through the circulators 3 and 4, and are terminated by the terminators 5 and 6 that are connected to the circulators. The PIM measurement method of the first embodiment is characterized in that, since terminators are not required on the DUT side, affects caused by the PIM, which is generated at terminators and which is a conventional problem, do not occur. As previously described, since the PIM measurement unit 8 is separated because of the band elimination characteristic between the transmission terminal and the reception terminal of the DUP 7, a PIM generated at the terminals 5 and 6 does not become a problem.

Generally, in a case wherein the tip of the transmission line is short-circuited without terminating the transmission line based on characteristic impedance, test signals are fully reflected at the short-circuited end, and a standing wave of the test signals is generated along the transmission line. The position of the short-circuited end matches the anti-node of a current standing wave. The PIM measurement method of the first embodiment has a important feature that at the transmission line end is short-circuited by a DUT, and at the anti-node, a current standing wave of test signals is applied to the DUT. Since the current standing wave at the anti-node is always applied to the sample, the greatest current flows through the DUT. Therefore, the resultant state is the same as the state obtained by applying, to the sample, a test current signal at a higher level than when applied by the conventional PIM measurement method that assumes the performance of impedance matching. For example, it is known that the current value at the anti-node of the current standing wave in the full reflection state becomes a double of that in the matching condition. According to the high test signal level, the PIM can be more efficiently generated at the DUT. When the test signal output level of the test signal generation units is the same, the PIM measurement can be performed with higher sensitivity. Further, conditions required for a power amplifier, etc., provided for the test signal generation unit, can be relaxed.

Furthermore, the PIM measurement method according to the first embodiment employs a simple sample structure where the DUT is connected to the tip of the transmission line 9 by using soldering. Therefore, the method provides a great advantage in that a limitation on the shape of a sample can be eliminated, while this is a problem that must be solved for the conventional PIM measurement performed on the assumption of the impedance matching condition. The DUT can evaluate not only a linear conductor, a rod shaped conductor or a prism-shaped conductor, but also a composite member formed by applying, plating or welding a test material to a base material. In addition, the method has another great advantage in that the DUT is considerably smaller than that employed for the conventional PIM measurement method based on impedance matching condition. For example, in a case wherein a UT141, semi-rigid cable is employed as a transmission line, the size of a sample is around several mm. A problem of distribution constant circuit, due to a large sample used for the conventional PIM measurement method, and a problem with the unstable performance of a PIM measurement, caused by the interference of multiple PIM sources, can be avoided.

It should also be focused on that, since the DUT is very small and the anti-nodes of the current standing wave are accurately positioned at the DUT, a test current signal is concentrated on and is applied to the DUT. The current density of the current standing wave is easily calculated, and the density of a current that flows across the material portion to be evaluated can be more accurately quantified. An arbitrary number and shapes of samples can be employed by providing independent control of parameters, such as a line width, a line length and a film thickness. In either case, superior performance that can not be provided by the conventional PIM measurement method, performed on the assumption of impedance matching condition, can be provided, i.e., flexible selection is available for measurement parameters, and quantification of parameter values is enabled. Further, the PIM measurement method of the first embodiment, which employs a standing wave, has as a characteristic the fact that system noise in the measurement system can calibrated. The calibration of system noise will now be described.

Embodiment 1-1

Figure 2A:
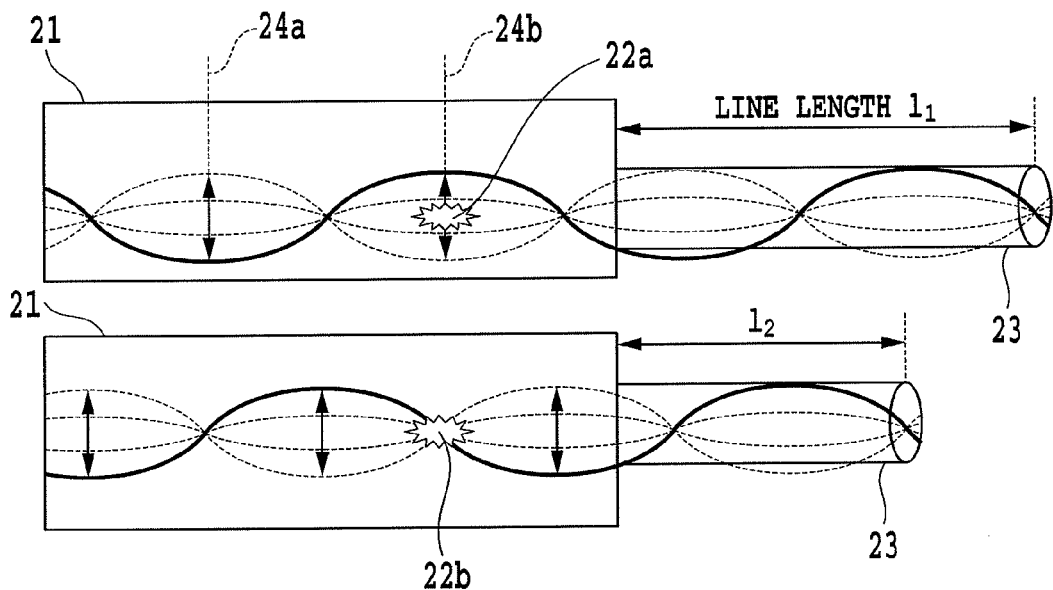
FIG. 2A is a conceptual diagram for explaining system noise produced in the overall PIM measurement system according to embodiment 1-1.
Figure 2B:
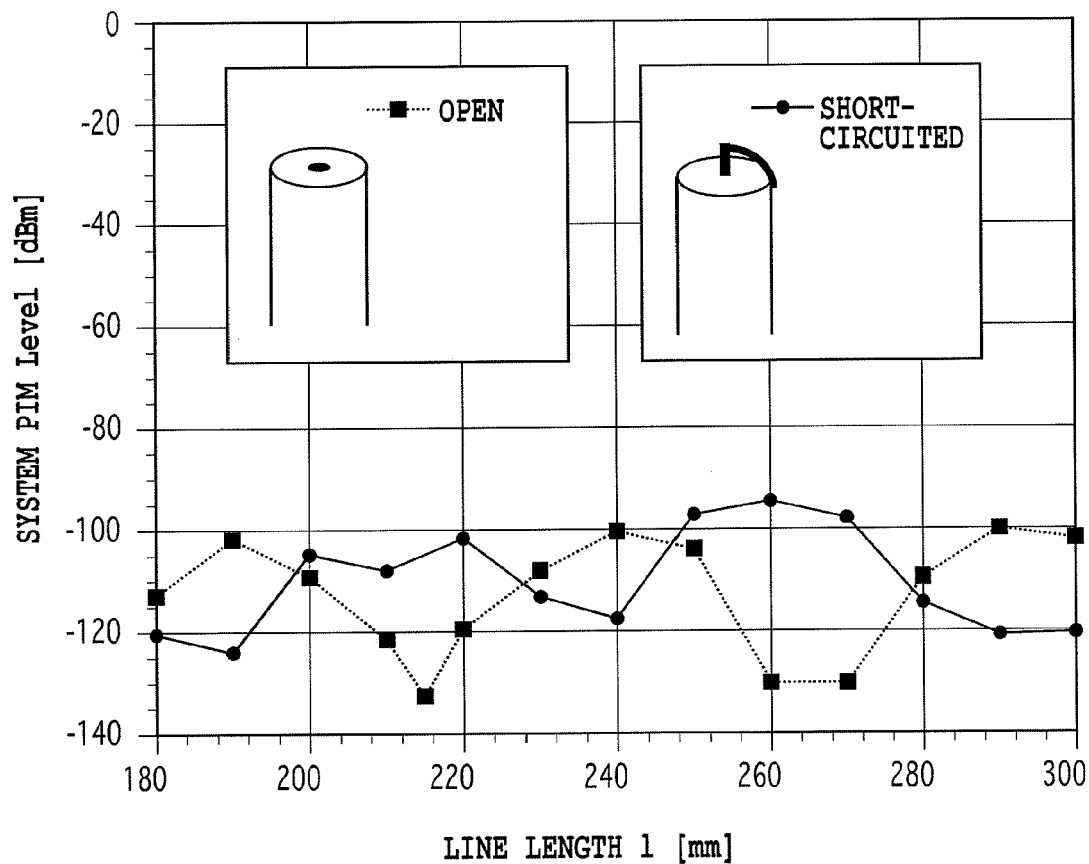
FIG. 2B is a diagram showing a relationship between the line length of a transmission line and system noise.

FIGS. 2A and 2B are diagrams for explaining the principle of system noise calibration by a PIM measurement method according to embodiment 1-1. FIG. 2A is a diagram for explaining the concept of system noise in the entire PIM measurement system for embodiment 1-1. In FIG. 2A, a transmission line 21 and a measurement system portion 21, which is a measurement system portion wherein a standing wave is generated, are conceptually shown. There is a case wherein the measurement system portion 21 includes a measurement system portion where a PIM is generated due to a factor other than a DUT, i.e., a system noise source 22$a$. Such portions are, for example, a contact point portion of a deteriorated connector, a soldered portion of a connector that is damaged by mechanical stress and the inside of the filter of a measurement apparatus. In order to perform a highly sensitive PIM measurement for a DUT, simply the length of a transmission line need be adjusted, so that the position of the system noise source 22$a$ matches the node of a current standing wave, as much as possible.

In FIG. 2A, distributions of current standing waves are shown when the tip of the transmission line is open and the transmission line 23 has a length of $l_1$ or a length of $l_2$. At this time, in a case wherein the tip is open, the tip portion of the transmission line becomes a node of a current standing wave. It should be noted that, compared with a case wherein the tip is short-circuited, the anti-nodes and the nodes of a standing wave are reversed. In the case wherein there is the line length $l_1$, since the position of the system noise source 22a matches the anti-node of the current standing wave, the PIM generated due to the system noise source 22a is measured at the highest level. On the other hand, in the case wherein there is the line length of $l_2$, since the system noise source 22b is positioned at the node of the current standing wave, the PIM generated due to the system noise source 22b is measured at the lowest level. According to the PIM measurement method in embodiment 1-1, since the tip of the transmission line is short-circuited using the DUT, the lowest system noise is obtained by the PIM measurement performed when the greatest line length is employed, such that the system noise becomes the highest when the tip is opened.

FIG. 2B is a diagram showing a relationship between the line lengths, of a transmission line with an open tip and a transmission line with an short-circuited tip, and system noise. Test signals of $f_1$=2200 MHz and $f_2$=2050 MHz are input and a third-order PIM signal $f_3$=1900 MHz is observed. The level of these test signals is +43 dBm at the antenna terminal of a DUP (under a matching condition). The system noise level reaches the highest every 50 mm of the length of the transmission line, such as 190 mm, 240 mm and 290 mm. The length of 50 mm corresponds to ½ of the wavelength 100 mm in a UT141 semi-rigid cable at 2 GHz. Therefore, when a line length such that system noise is at the highest level when the tip that is open is employed, system noise for the short-circuited tip is at the lowest level near −130 dBm. Actually, the center conductor of the transmission line having the short-circuited tip is projected a distance of around several mm to be used for the connection of the sample. The optimal line length is determined while taking into account the inductance component of the projected center conductor.

As described above in detail, according to the PIM measurement method in embodiment 1-1, the anti-node of the current standing wave matches the position of the DUT. Further, the position of the current standing wave in the transmission line is also exactly obtained based on the frequency of the test signals and the characteristic of the transmission line. When the end of the transmission line is open, the characteristic of system noise can be obtained, and system calibration can be easily performed by determining the line length. Therefore, a broad dynamic range for a PIM measurement is obtained. It should be recognized that this PIM measurement method has as a feature a function whereby the current levels and profiles of test signals can be obtained quantitatively and accurately by employing a current standing wave. A description will now be given for a specific measurement example that employs the PIM measurement method according to the first embodiment.

Figure 3B:
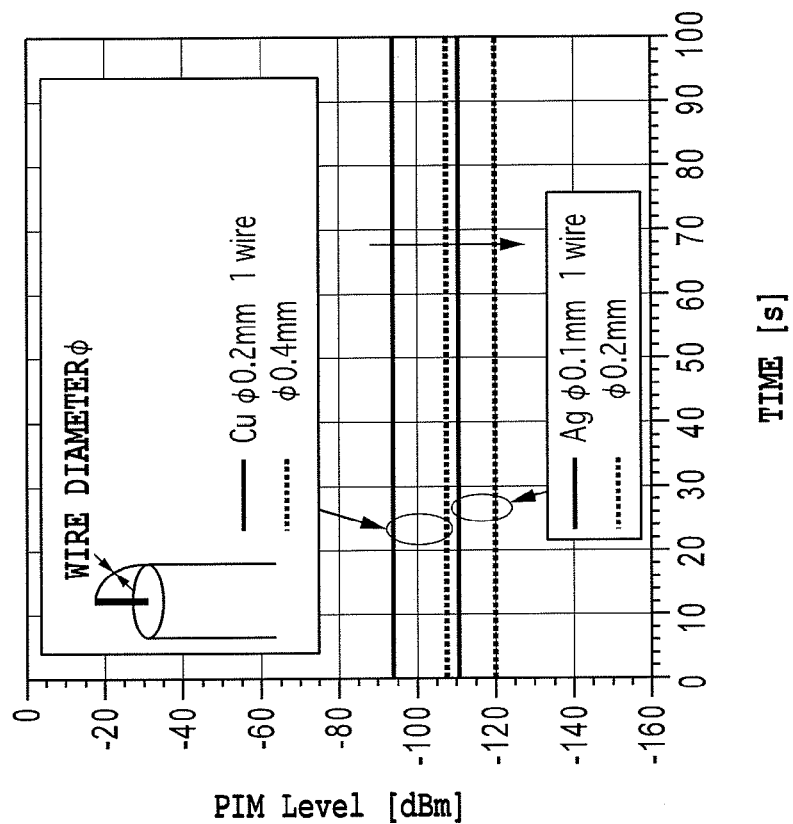
FIG. 3B is a diagram showing the time-transient change of the PIM level by employing, as parameters, the material and the diameter of a sample.
Figure 3A:
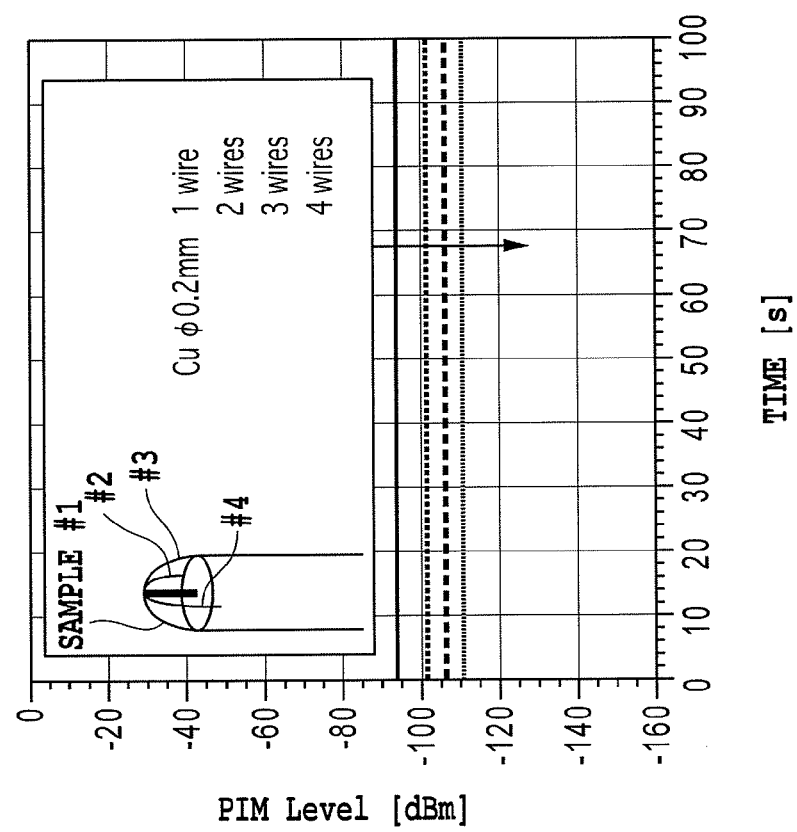
FIG. 3A is a diagram showing the PIM measurement results copper wire obtained by the PIM measurement method in embodiment 1-1, and indicating the time-transient change in the PIM level when the number of copper sample wires is employed as a parameter.

FIGS. 3A and 3B are diagrams showing the PIM measurement results for a copper wire obtained by the PIM measurement method of embodiment 1-1. A transmission line employed for the measurement is a UT-141 semi-rigid cable, with an outer diameter of 3.58 mm, that includes a silver-plated copper center conductor having an outer diameter of 0.98 mm. The transmission line length of 180 mm was employed based on the above described calibration results. The center conductor was exposed from the tip of the transmission line a distance of 2.5 mm, and a sample was soldered there. The same frequencies as described previously, while referring to FIG. 2b, were employed for test signals and a PIM signal for receiving $f_1$=2200 MHz and $f_2$=2050 MHz, and for measuring a third-order PIM signal $f_3$=1900 MHz.

FIG. 3A is a diagram showing the time-transient change of a PIM level when the number of copper samples having a diameter of 0.2 mm is employed as a parameter. The samples have a constant length, i.e., about 5 mm. When the number of copper wires (sample #1 to sample #4) is increased from 1 to 4, the PIM level is lowered. The current density can be calculated using the number of copper wires, the shape of the copper wires and the electric power of a test signal that is applied. It is understood that a constant proportional relation is present between the density of a current, which flows through the sample, and the PIM level. Further, the PIM measurement value continues to still be maintained after 100 seconds has elapsed, and the PIM measurement method can provide stable results longer than can the conventional method.

FIG. 3B is a diagram showing the time-transient change of the PIM level when sample materials (copper wires and silver wires) and the diameter of samples are employed as parameters. A clear difference for a PIM value in the material types can be identified between the copper wires and the silver wires. Further, the PIM value is smaller for a greater sample diameter. It can be found that a constant relationship is established between the current density, for the fine metal lines, and the PIM level.

Figure 4B:
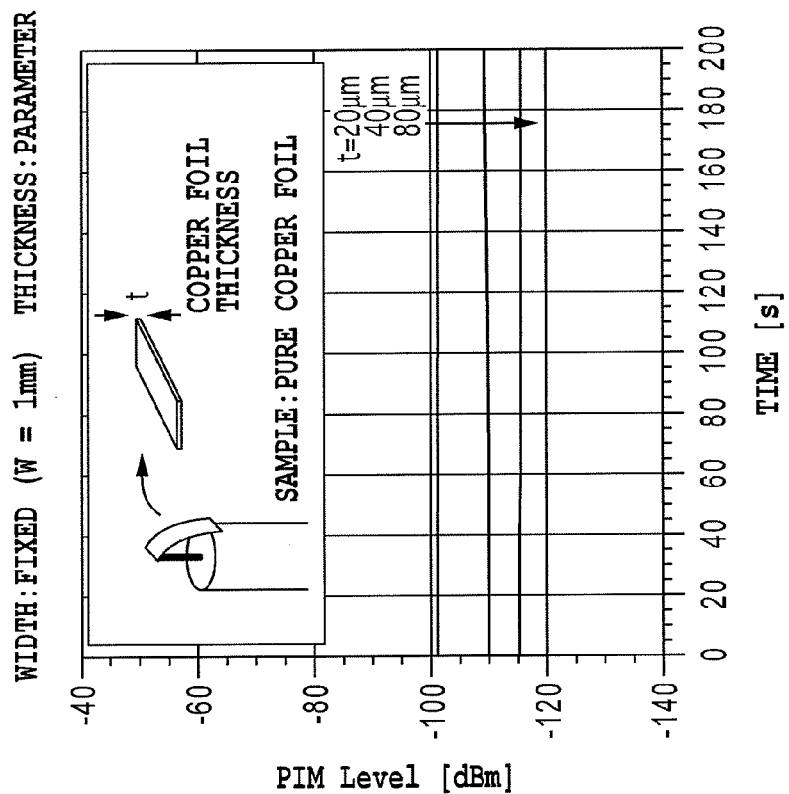
FIG. 4B is a diagram showing the time-transient change in the PIM level when the thickness of the copper foil is employed as a parameter.
Figure 4A:
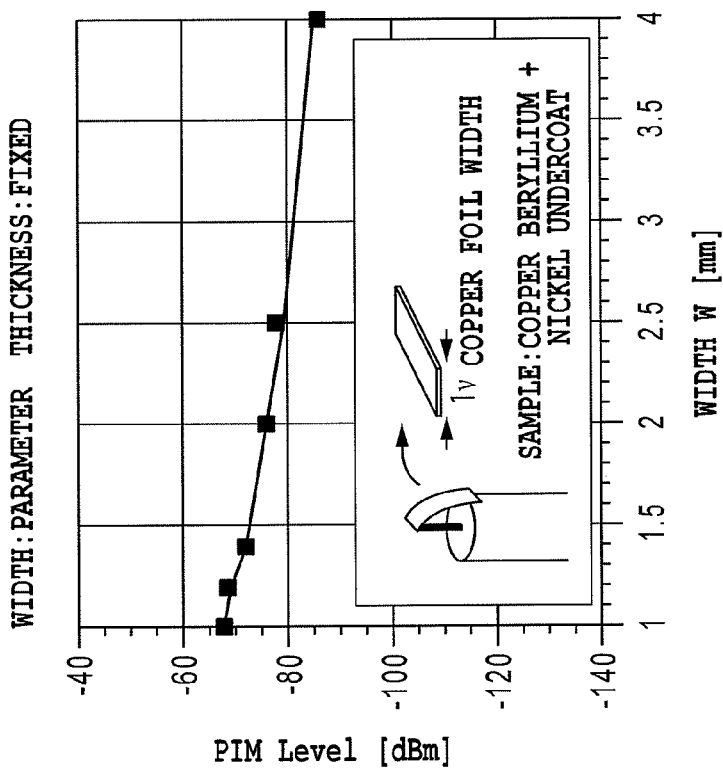
FIG. 4A is a diagram showing the PIM measurement results for copper foil obtained by the PIM measurement method in embodiment 1-1, and indicating a relationship between the width W of the copper foil and the PIM level.

FIGS. 4A and 4B are diagrams showing the PIM measurement results for copper foil obtained by the PIM measurement method in embodiment 1-1. The same arrangement as described while referring to FIG. 3 is employed for a measurement system that includes a transmission line. The sample copper foil is gold-plated copper beryllium foil, for which magnetic nickel is employed as an undercoat.

FIG. 4A is a diagram showing the relationship between a width W of copper foil and the PIM level. The relationship according to which the PIM level is lowered when the width W is increased can be easily understood. During the MSL measurement using the conventional PIM measurement method, the width of the metal conductor portion can not be freely and sequentially changed, because the impedance of the DUT must match the characteristic impedance of 50Ω. According to the PIM measurement method in embodiment 1-1, described above, the sample shape can be freely changed. Furthermore, the PIM measurement can be performed for an individual conductive material, without including a dielectric substrate material.

In FIG. 4B, the time-transient change of the PIM level is shown while the thickness t of the copper foil is employed as a parameter. The sample is pure copper foil having a width W of 1 mm. The relationship according to which the PIM level is lowered as the thickness t is increased can be easily understood. In addition, the PIM measurement value is little changed as time elapses, and the same measurement value is maintained. According to the PIM measurement method of embodiment 1, the sample should be soldered to the tip of the transmission line. Even when the measurement trial, including the soldering operation, is repeated three or four times, variances in the PIM measurement values fall only within 5 dB, and satisfactory reproducibility is provided.

As described above, according to the PIM measurement method in embodiment 1-1, since the sample is short-circuited at the tip of the coaxial line, a limitation due to impedance matching can be avoided for the shape of a DUT, and PIM evaluation can be performed by freely changing the parameter of the sample shape. The sample is considerably smaller than that employed for the conventional PIM measurement method, and a PIM measurement for only a sample that serves as a point source is enabled. Since the terminators are not employed to obtain an impedance matching for the DUT, the PIM generated in the terminators, which is the conventional problem, can be ignored. Further, since the calibration of system noise is performed while the tip is open, the system noise can be minimized and a PIM measurement having a wide dynamic range is enabled.

When the PIM measurement method in embodiment 1-1 is employed, a switch, for example, may be connected to a coaxial line end to measure the PIM property of the switch. A joint connector may be connected to the coaxial end, and a coaxial line having an appropriate length may be connected to the connector, so that the PIM property of the connector can be evaluated. Moreover, when a short circuit is provided in the printed circuit board state, the overall evaluation can be performed for the printed circuit board that includes the conductive portion and the other dielectric portion. For a simpler arrangement, a microstrip line may be employed for the transmission line, while the PIM measurement enabled range is limited.

Embodiment 1-2

The PIM measurement method for embodiment 1-1 is characterized by generating and employing a standing wave of test signals, without obtaining matching of a characteristic impedance for a DUT, which is required by the conventional PIM measurement method. The method in the above described embodiment employs a current standing wave by short circuiting the tip of a transmission line. However, the present invention is not limited to this method, and also focuses on and employs a voltage standing wave generated when the tip of a transmission line is open. When the tip of the transmission line is open, test signals are fully reflected at the tip portion, and a voltage standing wave of the test signals is generated along the transmission line. The tip of the transmission line corresponds to the position of the voltage anti-node of the voltage standing wave, and the voltage of the test signals becomes the highest. When the DUT is arranged at the open end of the transmission line, the highest voltage can be applied to the sample. With this arrangement, PIM can be measured for an electric material, such as a dielectric material, for which the tip of a transmission line can not be short-circuited.

Figure 5A:
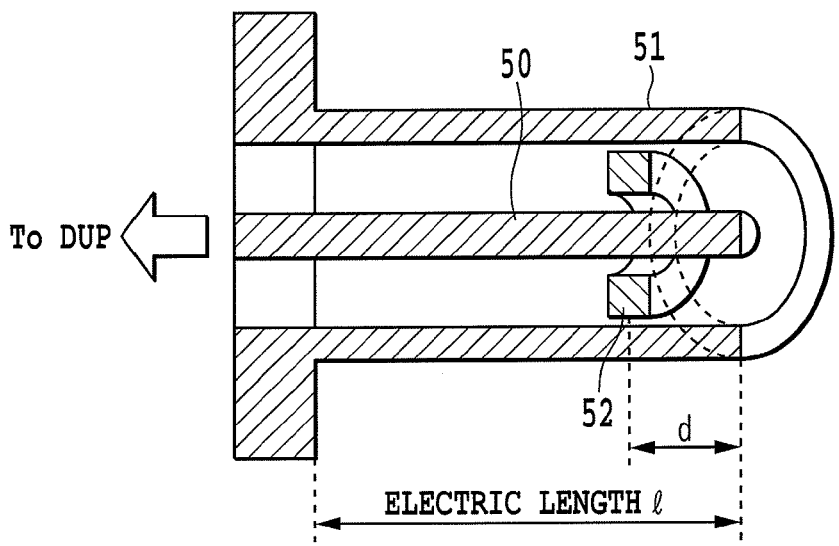
FIG. 5A is a diagram illustrating the structure of the portion of a device under test that is used for a PIM measurement system according to embodiment 1-2.
Figure 5B:
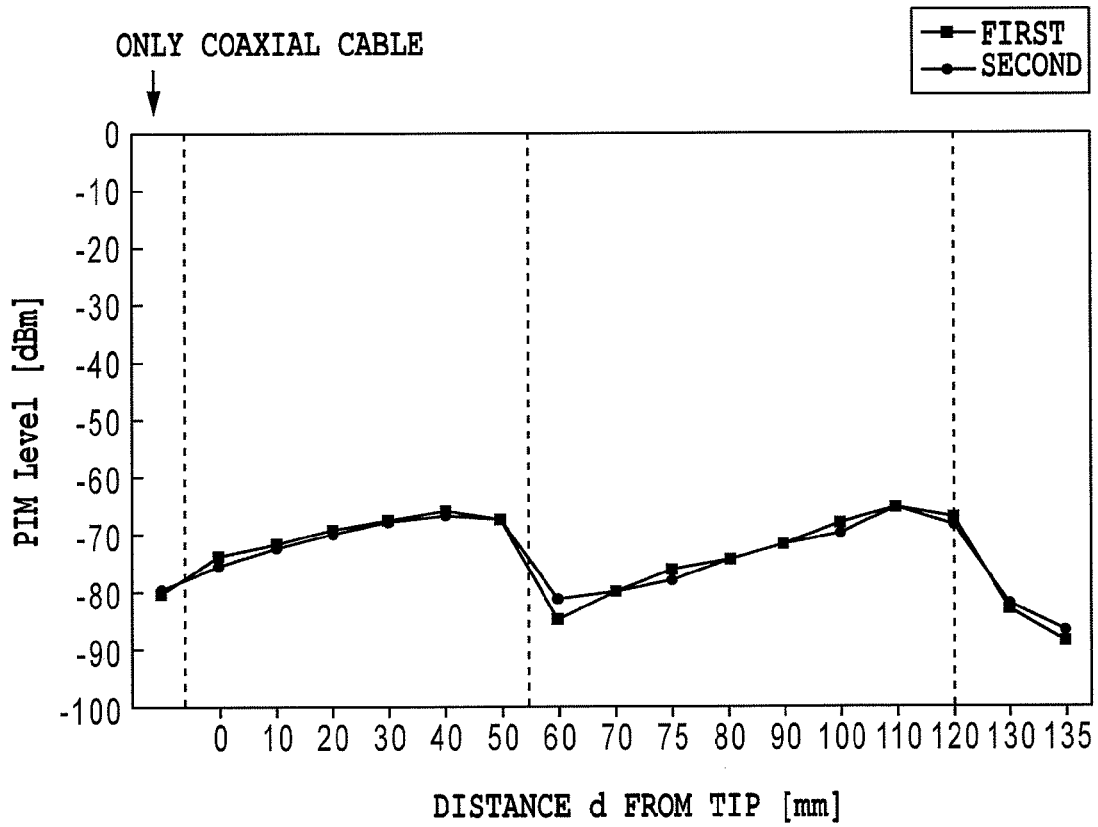
FIG. 5B is a diagram showing a relationship between the position of a sample and a PIM level.

FIGS. 5A and 5B are diagrams for explaining the PIM measurement method in embodiment 1-2. FIG. 5A shows the structure of the portion of the DUT in a PIM measurement system wherein the tip of a transmission line is open. When the transmission line 9 and the DUT 10 in the arrangement in FIG. 1, with the open transmission line tip, is replaced with the structure shown in FIG. 5A, the arrangement for the PIM measurement system that employs a standing wave is obtained. In FIG. 5A, a coaxial cable with an open end is shown, which includes an outer conductor 51 and an inner conductor 50 with space between the two conductors. The left end of the coaxial cable is connected to the DUP 7 illustrated in FIG. 1. When a sample 52 is located at an arbitrary position in the space in the coaxial cable, either a current standing wave or a voltage standing wave of test signals, generated due to opening the tip of the coaxial cable, is applied to the sample. It should be noted that the anti-nodes of the current standing wave correspond to the node positions of the voltage standing wave.

FIG. 5B is a diagram showing a relationship, obtained by the PIM measurement method employing a standing wave, between the position of a sample and a PIM level. The coaxial cable has an outer diameter of 20 mm, the inner conductor has a diameter of 8.5 mm and an overall length of about 180 mm. A donut-shaped ferrite core sample is located at a distance d from the open end face of the coaxial cable. The sample has a disk shape with an outer diameter of 18.5 mm, an inner diameter of 12 mm and a thickness of 8 mm. The same frequencies as previously described, while referring to FIG. 2B, are employed for test signals and a PIM signal, i.e., $f_1=2200$ MHz and $f_2=2050$ MHz are input and a third-order PIM signal $f_3=1900$ MHz is measured. The PIM measurement values indicated in FIG. 5B are medians for 100 seconds after test signals were supplied to the sample and the stable condition was obtained along the time axis.

The PIM level periodically fluctuates about every 60 mm, which is shorter than ½ a wavelength (75 mm), inside the coaxial cable at 2 GHz. This probably occurs because ferrite having a high magnetic permeability is locally inserted in the same axial period, thus shortening the wavelength. It is believed that when the ferrite in this example is employed, the magnetic material is affected by test signals at the highest point of the magnetic field. Therefore, it is assumed that the PIM level reaches the maximum value at the highest current point, i.e., at the position of the node of the voltage standing wave. According to this example, a sample can be arranged at an arbitrary position in the coaxial cable, and the test signal level to be applied can also be adjusted in accordance with the position of the standing wave of the test signals. When the sample is covered, for example, with an insulating tape (e.g., a polyimide tape) that does not generate PIM, PIM can be measured for a conductive material other than an insulating material, such as a dielectric material. In addition, when the sample is arranged in a different direction, a directional difference in PIM measurement values can be easily compared.

When the PIM measurement method of this example is employed, an evaluation for the PIM property can be performed, for example, for the dielectric member portion of a printed circuit board that is gripped at the tip of a transmission line. In this case, the anti-node portion of the voltage standing wave is employed.

As described above, according to this example a limitation due to impedance matching can be eliminated for the shape of a DUT, and the PIM evaluation can be performed by freely changing the parameters for a sample shape. The sample is considerably smaller than that conventionally employed, and a PIM measurement can be performed for a sample that is only used as a point source. Since the terminators are not required to obtain impedance matching of the DUT, PIM generation by terminators, which is a problem for the conventional PIM measurement method, can be ignored. An appropriate capacitor may be connected to the tip, so that a current standing wave can be generated in the DC isolated state. As a result, the PIM property of an insulating material, such as a dielectric substrate, can be evaluated.

Embodiment 1-3

The PIM measurement method of the first embodiment can be more variously modified and used. As previously described, according to the PIM measurement method of the first embodiment, the size of a sample can be very much reduced, and a standing wave generated by reflected waves in the mismatched condition is employed. Therefore, the method is characterized in that test signals of a high level are supplied to a sample to increase either the density of a current or the intensity of an electric field to be applied to the DUT. Next, a description will be given for another example wherein the current density at the sample is further increased to enable a PIM measurement having greater sensitivity.

Figure 6A:
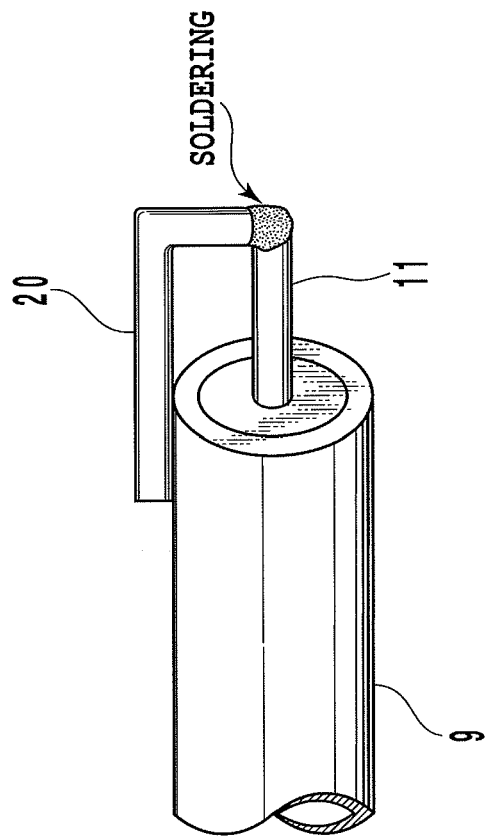
FIG. 6A is a diagram illustrating the structure of a sample portion used for a PIM measurement method according to embodiment 1-3, i.e., showing a point-contact structure.
Figure 6B:
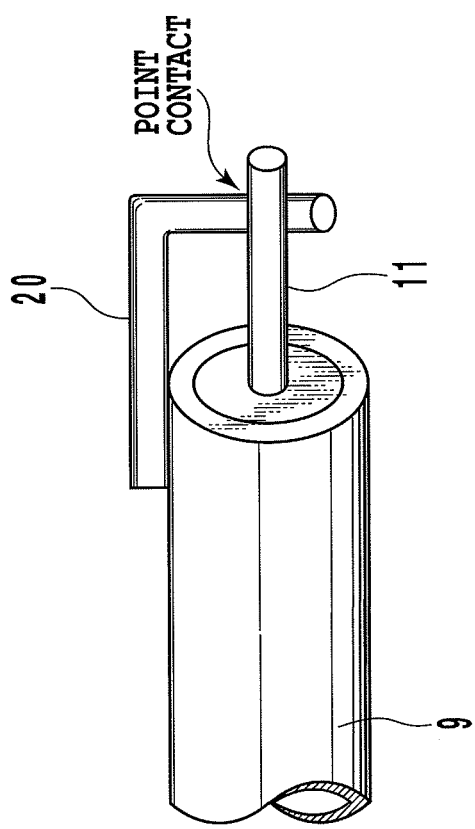
FIG. 6B is a diagram illustrating the structure of a sample portion that is soldered.

FIG. 6A is a diagram illustrating the structure of a sample portion for a PIM measurement method according to embodiment 1-3. The same structure as in FIG. 1 is employed, except that a DUT 20 having a rod shape is employed to short-circuit the portion between a center conductor 11 and the outer conductor at the tip of a transmission circuit. In this embodiment, one end of the DUT 20 is connected to the outer conductor by using soldering, and the other end is connected to the center conductor 11 by point contact using an electric point contact. FIG. 6B shows, as a comparison, the structure in FIG. 1 where the two ends of the DUT 20 are welded, for example, by soldering. The DUT 20 in FIGS. 6A and 6B have an L shape; however, the shape is not limited to this. A plastic fixing tool, for example, may be employed to apply a constant point pressure to the electric contact point. The connection method employed for FIG. 6B may be used for a property evaluation for a material consisting of the center conductor 11 and the DUT 20.

The radius of the point-contact electric contact point can be obtained by measuring a DC resistance using a conventional 4-probes method. For example, two cylindrical wire materials having a diameter of 1 to 2 mm are crossed and pressed together, and an electric contact point having a diameter of several 10 to 100 μm can be obtained. Further, when the PIM measurement method in embodiment 1-1 is employed for the sample having the structure shown in FIG. 6A, and when the tip is short-circuited, a current flows through the rod-shaped conductor of the DUT at a high frequency level, corresponding to the anti-node of a current standing wave. When more current is concentrated at the electric contact point in FIG. 6A, the PIM measurement having a high sensitivity can be performed for the material near the electric contact point.

Figure 7:
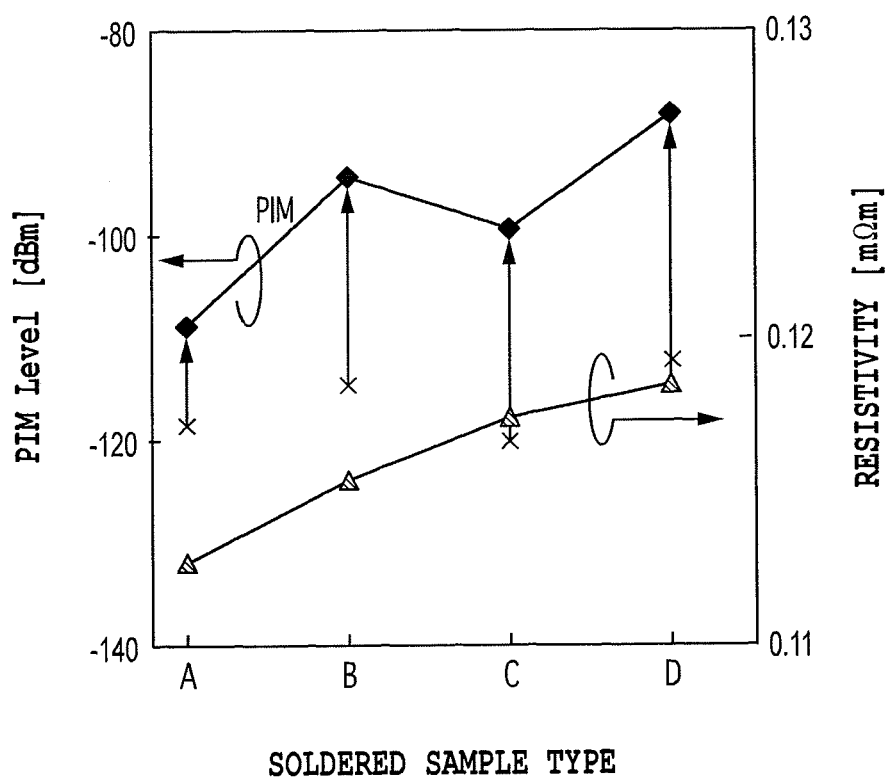
FIG. 7 is a diagram showing the PIM of a soldered sample and a sample resistivity obtained by a PIM measurement method according to embodiment 1-3.

FIG. 7 is a diagram showing a PIM for various soldered samples and the resistivity of the samples obtained by the PIM measurement method of this embodiment. A transmission line employed for the measurement is a UT-141 semi-rigid cable having an outer diameter of 3.58 mm and an included silver-plated copper center conductor having an outer diameter of 0.98 mm. The center conductor is also plated with tin, which is a main solder component, in order to avoid PIM generation due to a contact made between different types of metal. The samples employed are rod shaped solder samples having 1.6 mm diameters, and respectively having compositions as shown in Table 1. The radiuses of the electric contact points, relative to the center conductor, are also shown in Table 1.

TABLE 1

| Sample | Composition | Contact radius a (μm) |
|---|---|---|
| A | Sn, Zn | 96 |
| B | Sn, Ag | 90 |
| C | Sn, Ag 3.5%, Cu | 91 |
| D | Sn, Ag 3%, Cu | 94 |

In FIG. 7, PIM levels are plotted for a case wherein a connection to the center conductor is employed as an electric contact point. X is employed to represent a case wherein the measurement was performed using the structure in FIG. 6B, where the two ends of the sample are soldered. In a case wherein an electric contact point is employed for either sample, the PIM level is increased 10 to 30 dB or more. Since the electric contact areas for the individual samples are equal, it is believed that the high frequency current densities for all are almost equal. It is obvious that when the structure in FIG. 6A is employed for this example, the PIM level of each sample is increased to a degree such that the samples can be compared based on differences in materials. It is assumed that the PIM level is related to the resistivity of the individual samples, and that an evaluation of an electric material is enabled through the PIM measurement performed for this example.

According to the PIM measurement method of the first embodiment, measurements can be variously modified by employing various structures for a sample. For the embodiments described above, an arbitrary shape, such as a line shape, a cylindrical shape, a prism shape, a ribbon shape or a foil shape, can be employed, so long as soldering can be performed or an electric contact point can be formed. Further, in a case wherein a dielectric substrate and a transmission line with an open end are employed, samples having various shapes can be arranged at arbitrary locations and in arbitrary directions. In addition, a powder, such as iron powder, that does not have a specific shape, and various electric components, such as FETs, LEDs and chips, that have complicated shapes can be evaluated.

As for the advantages provided by the above described fine conductive lines, not only is a connection easily performed, but also since lines are circular in cross section, a current is uniformly distributed, circumferentially, and the current density is easily calculated. As has already been described, the current density can be easily controlled using the number of fine lines and their diameters.

In addition, according to the PIM measurement method of the first method, a material to be evaluated may be applied, bonded, plated or welded to a line material used as a base metal, so that a PIM evaluation can be performed not only for a simple fine line material, but also for a composite material. For example, when a fine line, the surface of which is solder-plated, is evaluated by employing a material such as silver or copper as a base material, a PIM for a solder material can be evaluated, or a PIM can be measured for a compound on a face where the solder and the base material are bonded, or for a state wherein the solder and the base material are combined. This is because the thickness of the solder layer can be changed, or appropriate frequencies can be selected for the test signals and the distribution of a current density can be controlled based on the skin effect of a high frequency current.

Second Embodiment

According to the PIM measurement method of the first embodiment, a standing wave generated by mismatching has been employed to measure a PIM signal that is generated by a DUT. In the example in FIGS. 5A and 5B, for PIM measurement, a sample has been arranged at the inter-coaxial position corresponding to the anti-node of a voltage standing wave or a current standing wave. Thus, a transmission line is connected to a conductor box having an opening, and the structure can be applied for the use of a standing wave generated in the conductive box.

Figure 8B:
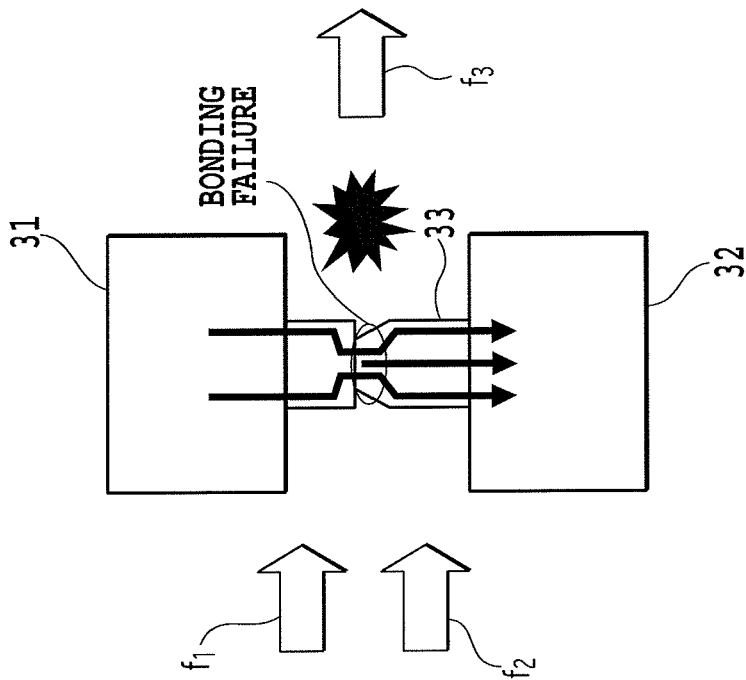
FIG. 8B is a conceptual diagram for explaining a case wherein a defective coupling is present in the connected portion.
Figure 8A:
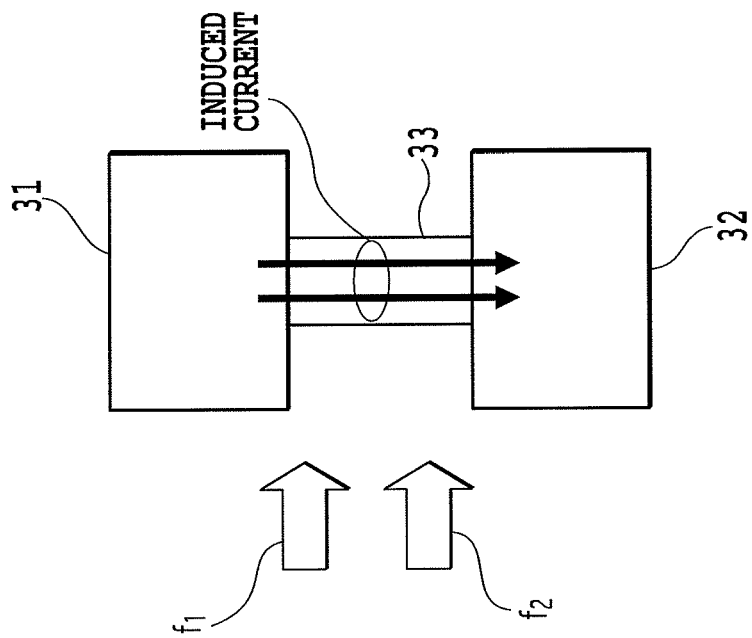
FIG. 8A is a diagram illustrating a connected portion for a PIM measurement method according to a second embodiment of the present invention.

FIGS. 8A and 8B are diagrams for explaining the concept of a PIM measurement method according to the second embodiment of the preset invention. A sample in FIG. 8A has a structure wherein a circuit A portion 31 and a circuit B portion 33 are connected via a connector 33. The sample may, for example, be an electronic component, an IC package or a printed circuit board. When test signals $f_1$ and $f_2$ are supplied to the sample, an induced current flows to the connector 33. Assume a case is one wherein a bonding defect is present at the connector 33, as shown in FIG. 8B. At the bonding defect portion, an electromagnetic noise component may be generated based on the induced current. Generation of electromagnetic noise and its generation level can be employed to determine whether a bonding failure is present. The electromagnetic noise can be detected as PIM distortion $f_3$, which has a frequency different from those of test signals. As previously described, since PIM is generated at a portion having only a little nonlinearlity, even a tiny bonding defective portion can be detected.

Embodiment 2-1

Figure 9:
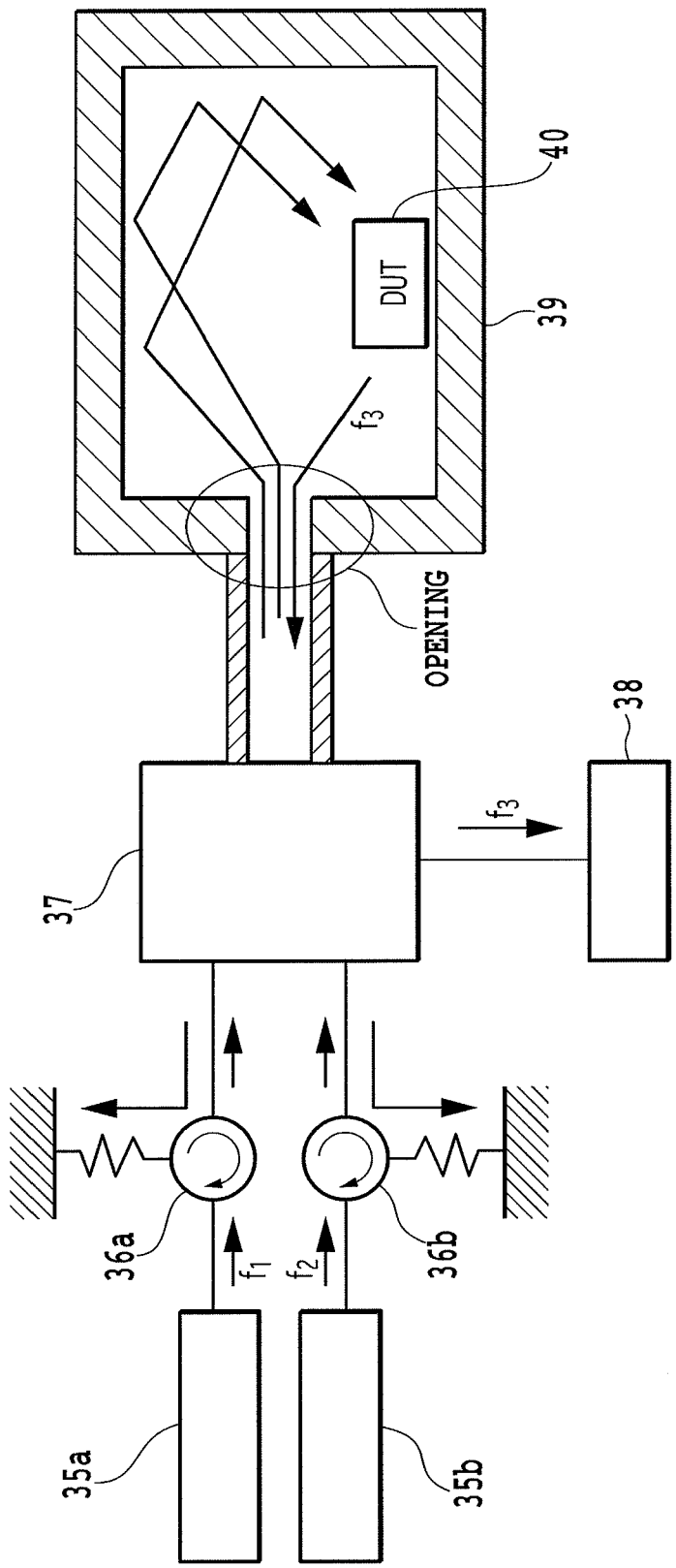
FIG. 9 is a diagram illustrating the arrangement of a system that detects a defective coupling portion using a PIM measurement method according to embodiment 2-1.

FIG. 9 is a diagram illustrating the arrangement of a system that detects a defective bonding portion using a PIM measurement method according to embodiment 2-1. This system is obtained by modifying the measurement system in FIG. 1, used for the PIM measurement method of the present invention, and the portion for generating and terminating test signals and the portion for separating/detecting a PIM signal are commonly employed. Specifically, the structure and the operation of test signal generation units 35a and 35b, circulators 36a and 36b, terminators 43a and 43b, a DUP 37 and a PIM measurement unit 38 are those used for the PIM measurement method in FIG. 1, and no further explanation for them will be given. A transmission line 42, connected to the antenna terminal of the DUP 37, is connected to a conductor box 39 via an opening. A DUT 40 is arranged inside the conductor box 39.

Two test signals transmitted via the opening generate a standing wave inside the conductor box 39. The DUT 40 can be located in accordance with its property at a position corresponding to the anti-node of a current standing wave or the anti-node of a voltage current wave, or at a position corresponding to an appropriate test signal level. A distribution for a standing wave can be obtained in advance based on the size of the conductor box 39 and the frequencies of the test signals. When the PIM detection is performed while the DUT is located in the standing wave environment, non-destructive testing for a connection failure can be performed for a small electric component, such as a semiconductor package or a printed circuit board, for which the connection to a high frequency power source is difficult. When a standing wave is employed, power efficiency relative to test signals is superior, and the sensitivity with which PIM can be detected is high. Further, the PIM excitation state can be controlled by adjusting a positional relationship between a standing wave and a sample, and when test signals having appropriate frequencies are selected, the position of a defect can be specified. It should be noticed that when the conductor box 39 of the system that detects a connection defect portion is regarded as a transmission line, the arrangement is the same as that used for the measurement system employed for the PIM measurement method of the present invention shown in FIG. 1.

Embodiment 2-2

Figure 10:
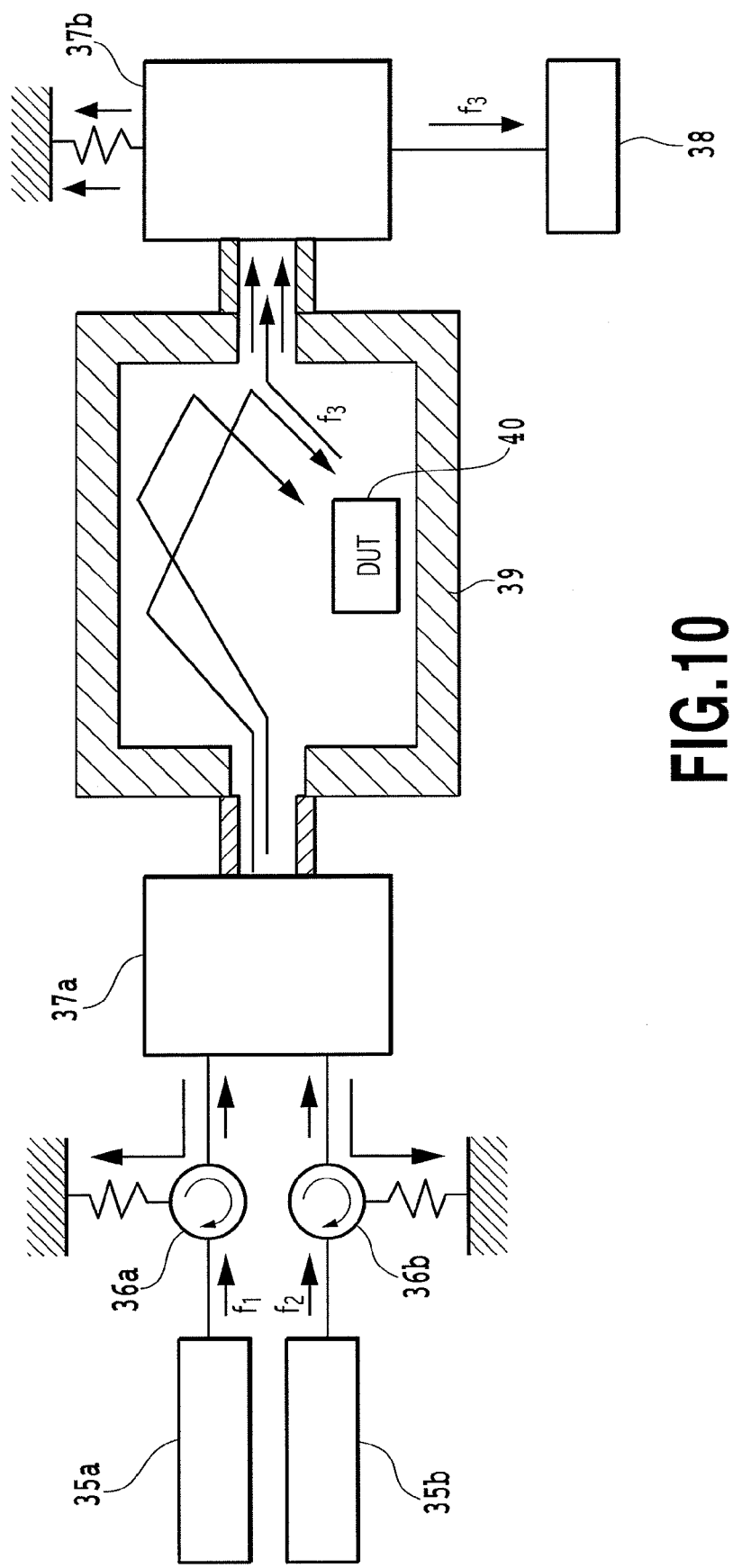
FIG. 10 is a diagram illustrating a system that detects a defective coupling portion using a PIM measurement method according to embodiment 2-2.

FIG. 10 is a diagram illustrating the arrangement of a system that detects a bonding defect portion using a PIM measurement method according to embodiment 2-2. The same method as in the case in FIG. 9 is employed for the input of test signals to a conductor box 40, and only the structure of a PIM measurement unit is different. Specifically, another opening is formed opposite the opening in a conductor box 39, and is connected to a second DUP 37b. The second DUP 37b is further connected to a terminator 43c and a PIM measurement unit 38. The operation for detecting a failure position using PIM is performed in the same manner as in the case in FIG. 9. Further, the shape of the conductor box 39 is not limited to a rectangular parallelepiped, and any shape can be employed so long as a standing wave can be generated. Furthermore, the openings for the input of test signals and for the detection of a PIM signal need not be located opposite each other. It should be noted that the same means as the previously described PIM measurement method of this invention is employed to excite a PIM using a standing wave.

When the system having the structure in embodiment 2-1 or 2-2 for detecting a bonding failure is employed, only a conductor that induces a current need be additionally provided for a joint connector, and be arranged in a conductor box, for the performance of a non-contact evaluation of the PIM property of the connector.

Embodiment 2-3

Figure 11B:
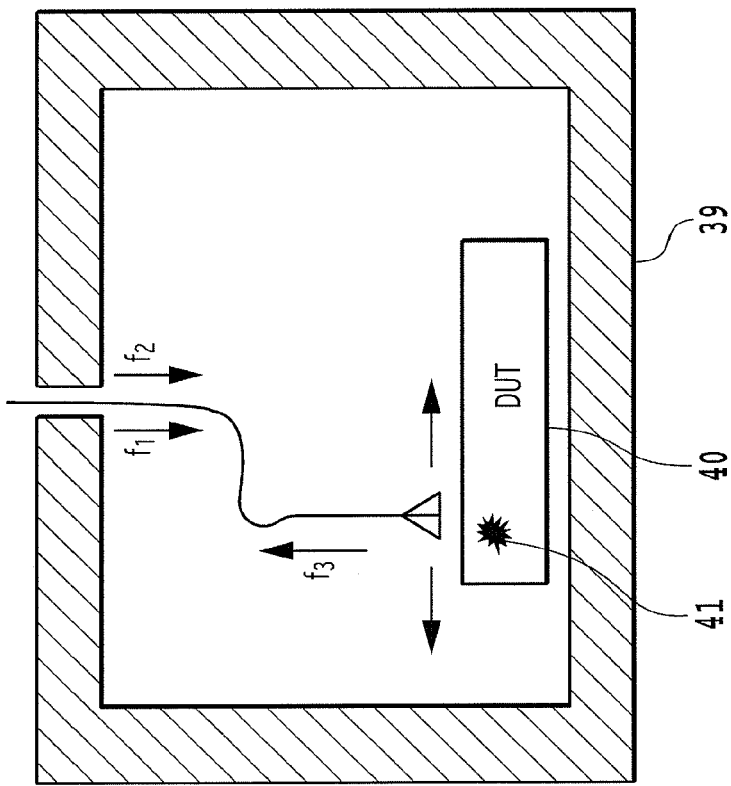
FIG. 11B is a diagram illustrating the arrangement of a system that detects a defective coupling portion using the PIM measurement method according to embodiment 2-2.
Figure 11A:
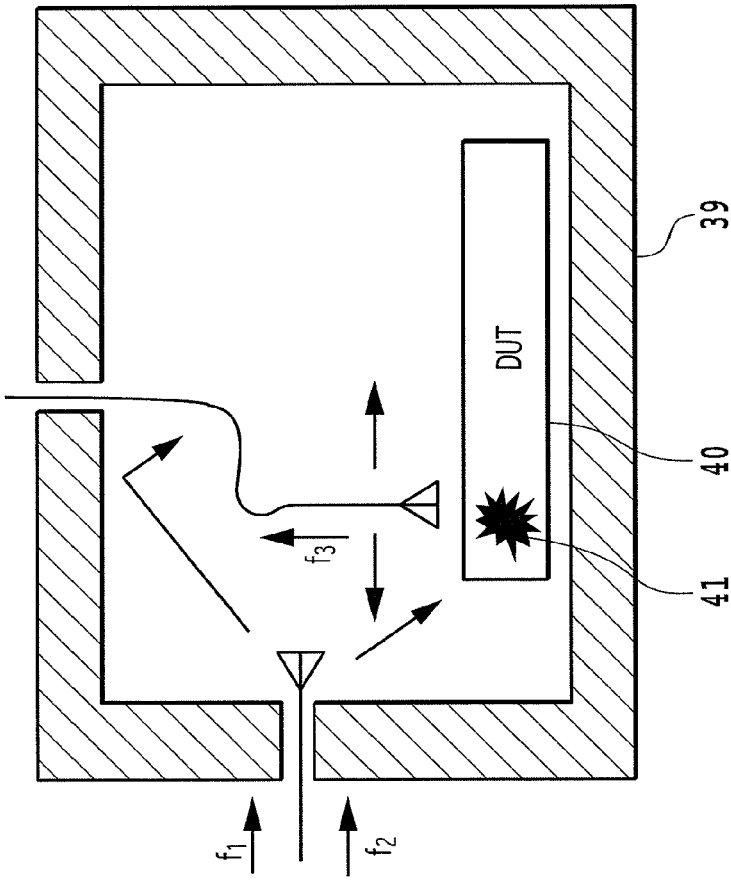
FIG. 11A is a diagram illustrating the arrangement of a system that detects a defective coupling portion using a PIM measurement method according to embodiment 2-3.
Figure 12B:
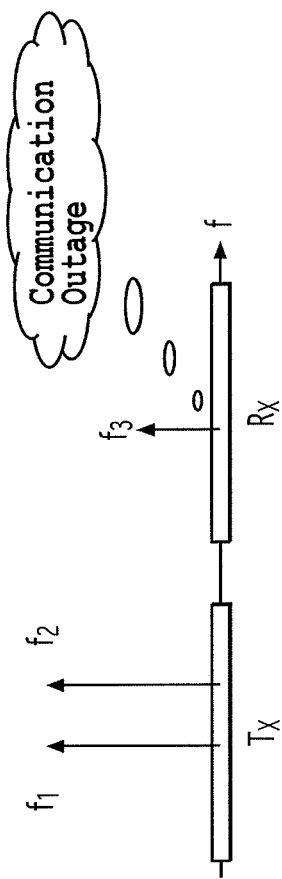
FIG. 12B is a diagram for explaining that PIM causes a communication outage.
Figure 12A:
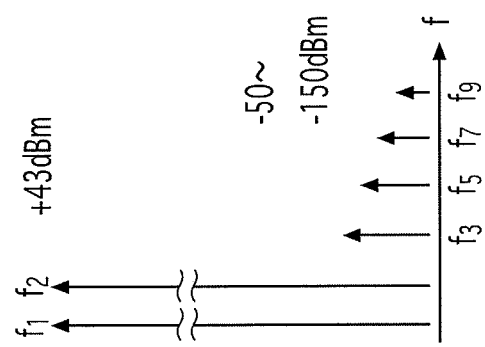
FIG. 12A is a diagram showing a PIM signal that is generated when test signals of frequencies $f_1$ and $f_2$ are input to a DUT.
Figure 13B:
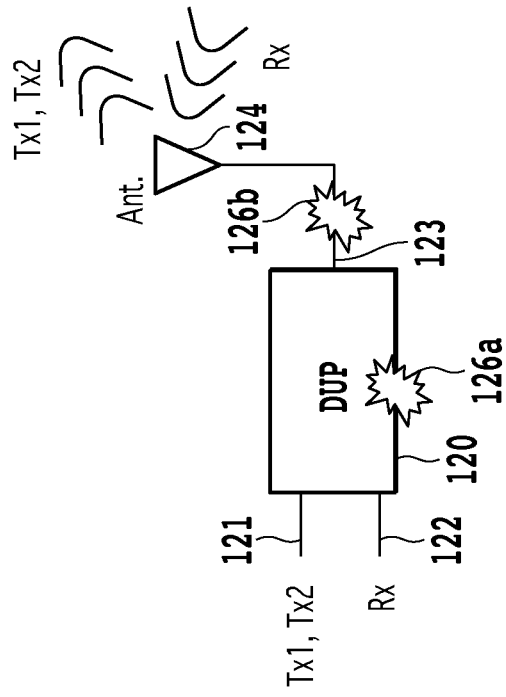
FIG. 13B is a diagram for explaining a PIM that is generated in a material.
Figure 13A:
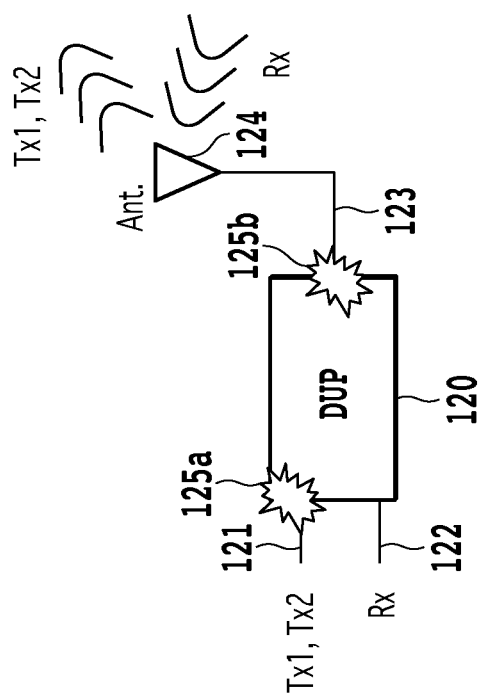
FIG. 13A is a diagram for explaining a PIM that is generated at a contact portion.
Figure 14:
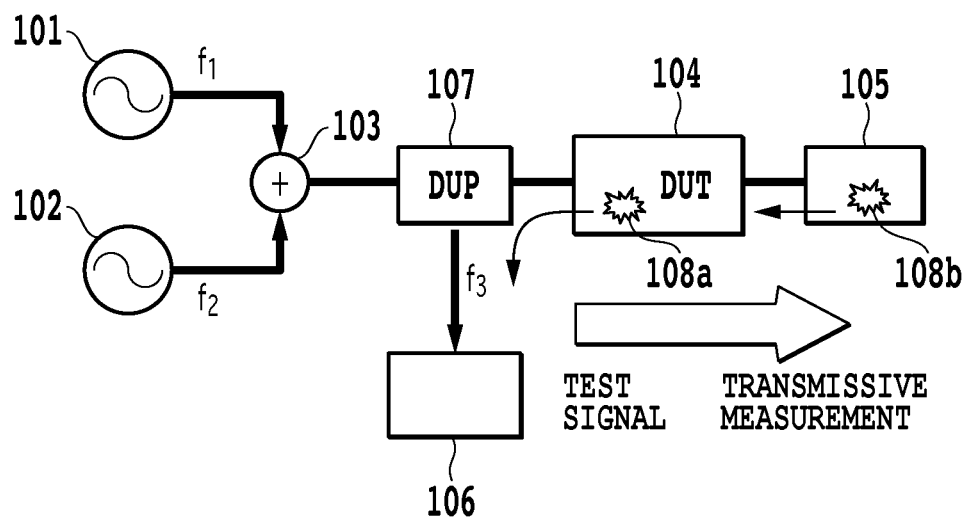
FIG. 14 is a diagram illustrating a conventional PIM measurement system for a high frequency band.
Figure 15:
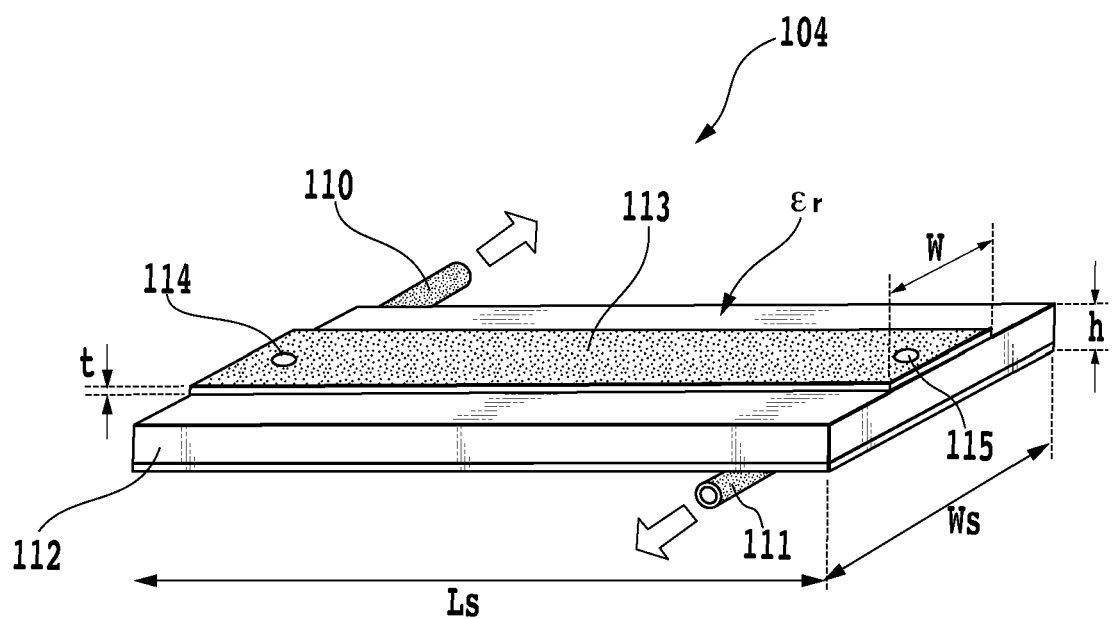
FIG. 15 is a diagram illustrating the structure of a DUT used for a case wherein a PIM for an MSL is to be measured.

FIGS. 11A and 11B are diagrams illustrating the arrangement of a system that detects a bonding defective portion using a PIM measurement method according to embodiment 2-3. For this modification, antennas are employed for inputting test signals that generate a standing wave inside a conductor box and for detecting a PIM signal. The arrangement in FIG. 11A includes an antenna for radiating test signals and an antenna for detecting a PIM signal. The arrangement in FIG. 11B includes only one antenna, used both for radiating test signals and for detecting a PIM signal. A DUT 40 is arranged inside a conductor box 39. According to the arrangement in FIG. 11A, a standing wave is generated in the conductor box 39, and the position of the DUT is employed to detect a difference in the PIM level relative to a PIM source 41 provided in the DUT 40. Further, when a reception antenna is movable, the position of the PIM source 41 in the DUT 40 can be specified. In the case in FIG. 11B, since the test signal generation source is also moved, the position of a standing wave is estimated from the position of the antenna, and is employed to determine the presence/absence of the PIM source 41, and its position, in the DUT 40. Since PIM detection is performed in the conductor box 39, this type of conventional failure detection need not be performed in an anechoic chamber.

In FIGS. 11A and 11B, when a coaxial line having a short-circuited tip is employed as an antenna, a non-contact evaluation using a test current flowing at the tip can be performed for the magnetic PIM property of the DUT. Further, when a coaxial line having an open tip is employed, a non-contact evaluation using a high voltage at the tip can be performed for the electric PIM property of the DUT. In this case, when the DUT is arranged near the tip of the coaxial line, the conductor box is not required for evaluation. This method will be described in a third embodiment.

In order to specify a PIM source in a DUT, the above described method that employs a movable antenna is available, or part of the DUT may be covered with a conductor to control the exposure to test signals. When the PIM measurement method in the second embodiment is employed for the detection of a defective portion, there is a probability, for example, that the connection failure of an IC package will be discovered, or that a defective portion will be specified. Since the connection failure can be detected in a state wherein an IC package is not operated, the method can be applied for connection failures or manufacture failures of various types of IC packages. In addition, since PIM detection is performed in a conductor box, the same type of conventional failure detection need not be performed in an anechoic chamber.

As described in detail, the PIM measurement methods and the measurement systems of the first and second embodiments provide remarkable effects that enable the affect produced by the matching terminators to be removed, and PIM detection can be highly sensitively performed using a DUT for which there are extremely few limitations in size and shape. The current density for generating PIM is easily quantified, and property evaluation is enabled for not only a metal material, but also for many other materials, including electric materials, such as dielectrics and magnets, and magnetic materials.

Third Embodiment

According to the PIM measurement method of the first embodiment, the transmission line end has been short-circuited using the DUT and the anti-node portion of the current standing wave of test signals has been applied to the DUT. According to the PIM measurement method of the second embodiment, the DUT has been located at the position of the anti-node of a standing wave that is generated in the conductor box, and an electromagnetic noise component, generated based on an induced current, has been detected. On the other hand, according to a third embodiment, since in the measurement system (FIG. 1) for the first embodiment the transmission line 9, which is connected to the DUP 7, can be regarded as an antenna 9, test signal frequencies $f_1$ and $f_2$, emitted at the tip of the transmission line 9, are projected to a DUT. Based on an induced current generated by the application of the test signals, an electromagnetic noise component is generated and is detected while the transmission line 9 is employed as a reception antenna.

Figure 16A:
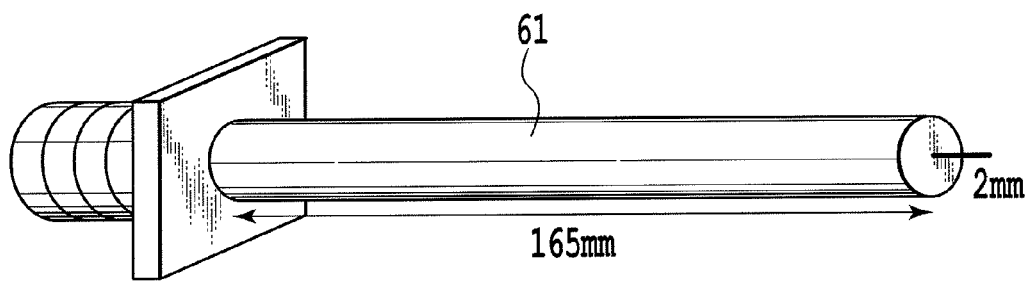
FIG. 16A is a diagram illustrating the structure of a transmission line for a PIM measurement method according to a third embodiment of the present invention.
Figure 16B:
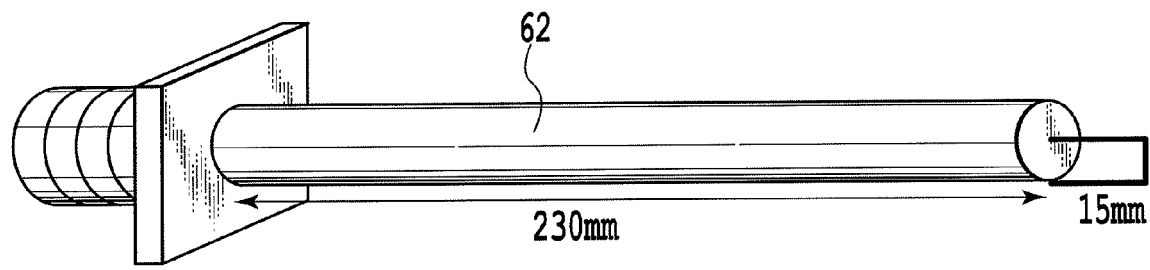
FIG. 16B is a diagram illustrating the structure of the transmission line for the PIM measurement method according to the third embodiment of the present invention.

FIGS. 16A and 16B are diagrams illustrating the structure of a transmission line employed for a PIM measurement method for the third embodiment of the present invention. In FIG. 16A, a transmission line 61 having a line length of 165 mm is shown that uses a UT-141 semi-rigid cable. The tip of the transmission line 61 is open, and the center conductor is exposed for a distance of 2 mm. The transmission line 61 serves as an open type probe, and is employed as the transmission line 9 of the measurement system shown in FIG. 1. Test signals $f_1$=2200 MHz and $f_2$=2050 MHz are input and a third-order PIM signal $f_3$=1900 MHz is observed. The level of these test signals is +43 dBm (under a matching condition) at the antenna end of the DUP. System noise in the case where the transmission line 61 is employed is −130 dBm.

FIG. 16B shows a transmission line 62 having a line length of 230 mm that is provided by employing a UT-141 semi-rigid cable. At the tip of the transmission line 62, the center conductor, which has a diameter of about 1 mm, is exposed for a distance of about 30 mm, and is folded over, in a loop shape, to form a short circuit with the outer conductor. When this transmission line 62 is used as a short-circuited probe, and is employed as the transmission line 9 of the measurement system in FIG. 9, system noise is −128 dBm.

Figure 17:
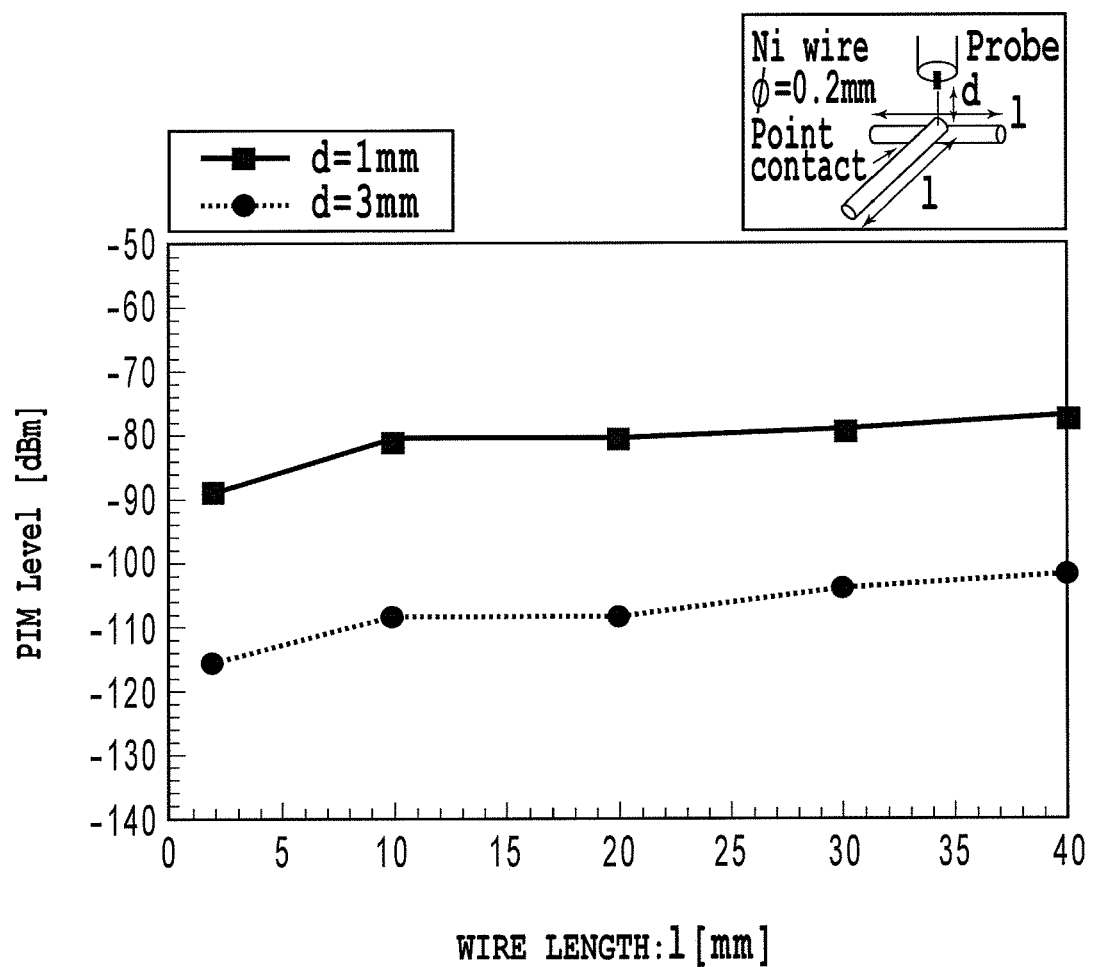
FIG. 17 is a diagram showing the PIM measurement results of a point-contact sample obtained by employing an open probe.

FIG. 17 is a diagram showing the PIM measurement results for a point contact sample obtained using an open probe. Two Ni wires that have diameters of 0.2 mm and lengths l were combined by point-contacting, and a T-shaped DUT was prepared. The distances from the DUT to the tip of the transmission line 61 were set at 1 mm and 3 mm, and a PIM level was measured by projecting test signals to the DUT. As is apparent from FIG. 17, the PIM level is increased as the length of the wire is extended. It is also found that a difference resulting from a change in the PIM level is small for a length of 10 mm or greater.

Figure 18:
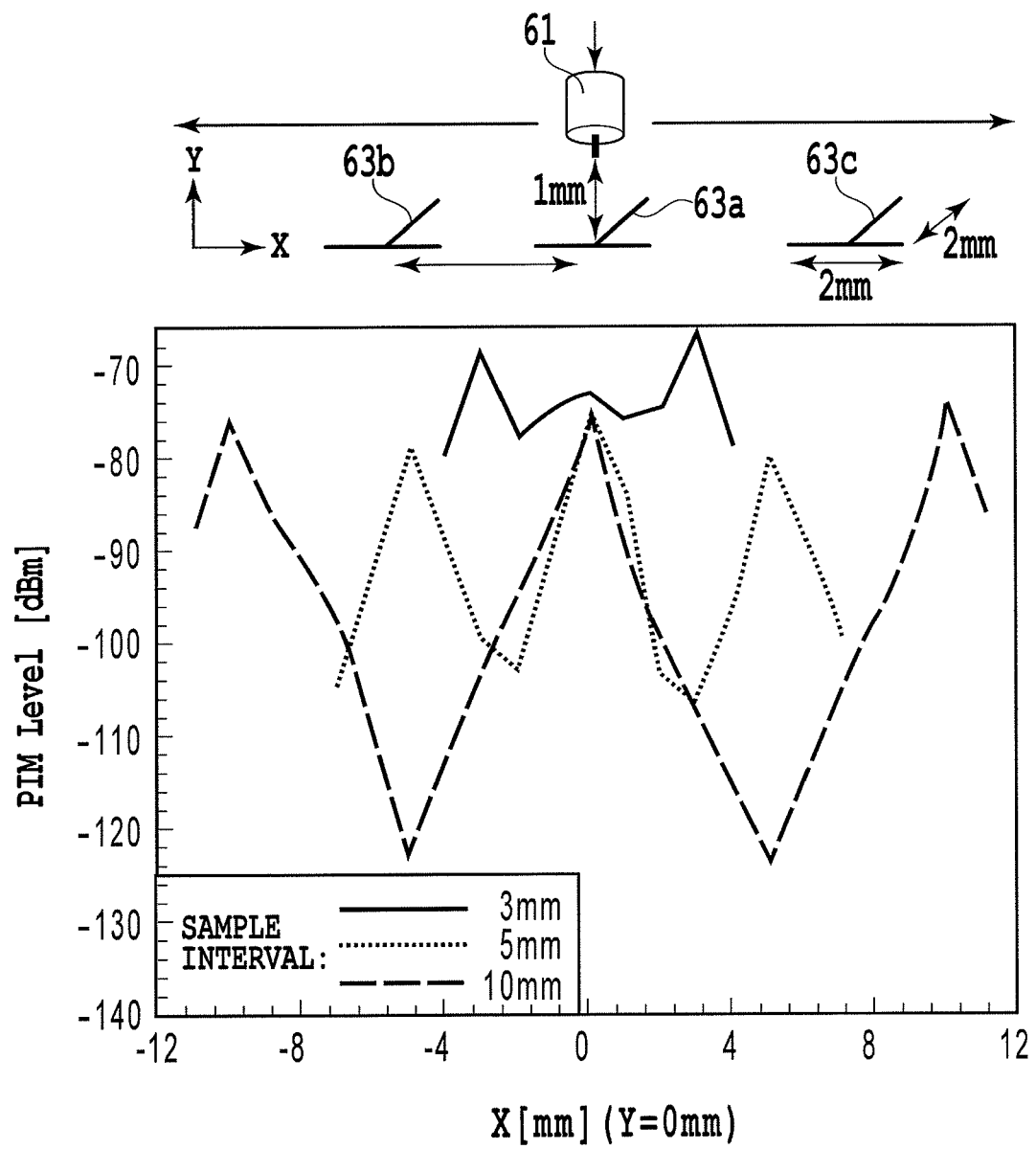
FIG. 18 is a diagram showing the resolution of an open type probe.

FIG. 18 is a diagram showing the resolution of an open type probe. Two Fe wires that have diameters of 0.2 mm and lengths of 2 mm were combined by point-contacting, and T-shaped devices under test were prepared. These three devices under test 63a, 63b and 63c are arranged at the center position X=0 and at positions at predetermined distances from the center position. Test signals were projected to the devices under test from a distance of 1 mm, between the DUT and the tip of the transmission line 61, and the PIM level was measured. As is apparent from FIG. 18, in a case for a sample interval of 3 mm, a difference in the peaks of the PIM levels is several dB, while in a case for a sample interval of 5 mm, a difference in the peaks of the PIM levels is 20 dB. Therefore, it is indicated that when the sample interval is 5 mm or longer, the position of the DUT can be identified. Further, when the frequencies of test signals are increased, the resolution can also be increased.

Figure 19:
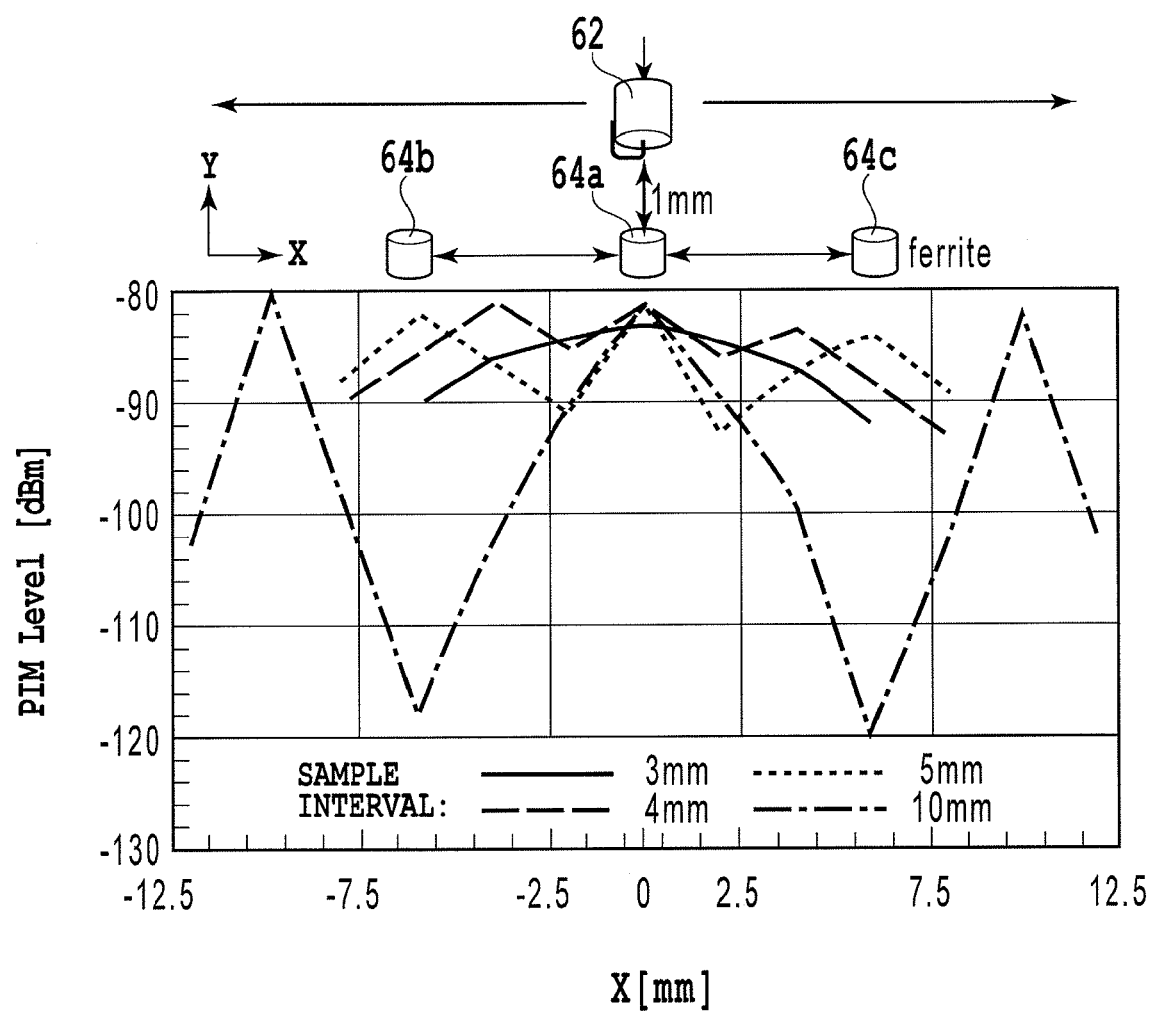
FIG. 19 is a diagram showing the resolution of a short-circuited type probe.

FIG. 19 is a diagram showing the resolution of a short-circuited type probe. As devices under test, three ferrite beads 64a, 64b and 64c having diameters of 0.5 mm and lengths of 1 mm were arranged at the center position X=0 and at positions at predetermined distances from the center position. Test signals were projected to the DUTs from a distance of 1 mm, between the DUTs and the tip of the transmission line 62, and the PIM level was measured. As is apparent from FIG. 19, in a case for a sample interval of 5 mm, a difference in the peaks of the PIM levels is 10 dB, and the positions of the DUTs can be identified.

According to the PIM measurement method of the third embodiment, the point contact portion of the DUT, i.e., a small connection failure portion, can be employed using an open type probe. Further, a defective portion can be detected using a short-circuited probe.

Figure 20A:
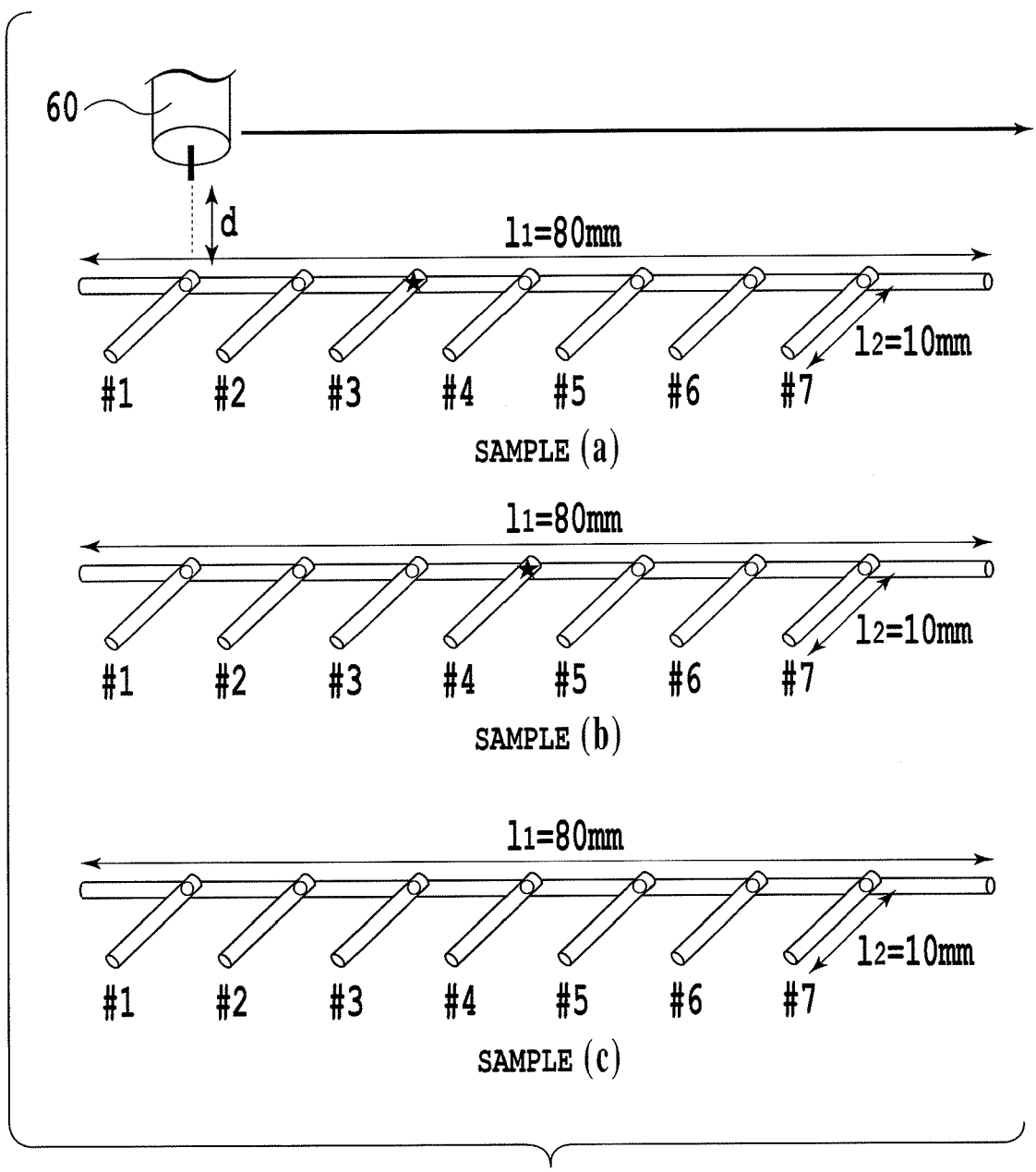
FIG. 20A is a diagram showing a DUT used for finding a connection failure using a PIM measurement method that employs an open probe.

An example for which the third embodiment is applied will now be described. FIG. 20A is a diagram showing a DUT that is employed to find a connection failure position using the PIM measurement method and an open type probe. For sample (a), seven Ni wires having diameters of 0.2 mm and lengths $l_2$=10 mm are connected at the same interval (10 mm) to an Ni wire having a diameter of 0.2 mm and a length $l_1$=80 mm. At this time, wires #1, #2 and #4 to #7 are connected by soldering (depicted by ○ in the drawing), and wire #3 is connected by point-contacting (depicted by star in the drawing). For sample (b), seven Ni wires having diameters of 0.2 mm and lengths $l_2$=10 mm are connected to a Ni wire having a diameter of 0.2 mm and a length $l_1$=80 mm at the same interval (10 mm). At this time, wires #1 to 3 and #5 to 7 are connected by soldering (depicted by ○ in the drawing), and wire #4 is connected by point-contacting (depicted by star in the drawing). For sample (c), seven Ni wires having diameters of 0.2 mm and lengths $l_2$=10 mm are connected to a Ni wire having a diameter of 0.2 mm and a length $l_1$=80 mm at the same intervals (10 mm). At this time, all the wires $\#_1$ to 7 are connected by soldering (depicted by ○ in the drawing).

Figure 20B:
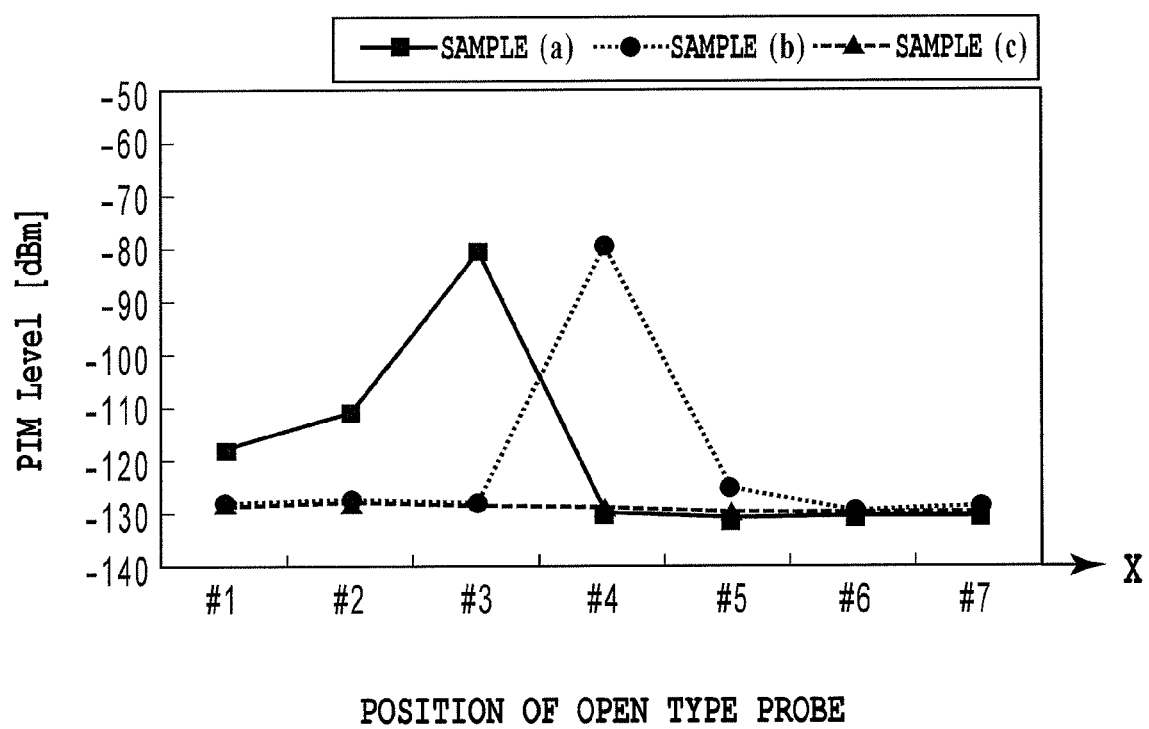
FIG. 20B is a diagram showing the search results of a connection failure using the PIM measurement method that employs an open type probe.

FIG. 20B is a diagram showing the search results for a connection failure by using the PIM measurement method that employs an open type probe. Test signals were projected from a distance 1 mm from the DUT to the transmission line 61, and the PIM level was measured while the position of the open type probe was changed along the Ni wire having a length $l_1$=80 mm. For sample I, the PIM level is extremely low, i.e., −120 dBm or lower, regardless of the probe position. On the other hand, for sample (a) and sample (b), which include point-contacting contact points, it is obvious that a high PIM is observed near the point-contacting contact points.

As described above, according to the PIM measurement method of the third embodiment, the transmission line connected to the DUP is employed in common as an antenna for projecting test signals to a DUT and as an antenna for receiving an electromagnetic noise component that is generated in the DUT. Therefore, a failure detection for an electronic device can be performed without contacting the DUT.

Fourth Embodiment

According to the third embodiment, the tip of the transmission line has been employed as the wave source (point wave source) for test signals, and the vicinity of the DUT has been scanned to detect PIM. However, since the transmission line 9 is in the mismatching condition, the electric power level of the test signals to be emitted and the electromagnetic noise component has to be very low, compared to the test signal output level of the test signal generation units. According to a fourth embodiment, a planar antenna that is in the matching condition relative to a signal generator is connected to the DUP 7 in the measurement system (FIG. 7) of the first embodiment. And test signals of frequencies $f_1$ and $f_2$, emitted by a two-dimensional plane wave source (a plane wave source), such as a patch antenna, are projected to a DUT that is located in the near field of the antenna, and PIM is detected. As well as in the third embodiment, since the antenna is in the matching condition while non-contact with the DUT is maintained, PIM can be efficiently detected using low power.

Here, the positional relationship between the antenna and the DUT is defined using the "near field" and the "far field". The "near field" is an area for which, viewed from the DUT, the antenna can not be regarded as a point wave source, and which is affected by the phase of an electromagnetic wave radiated by the antenna. An area at a distance from the near field is called the "far field", for which the antenna can be regarded as a point wave source.

Figure 21:
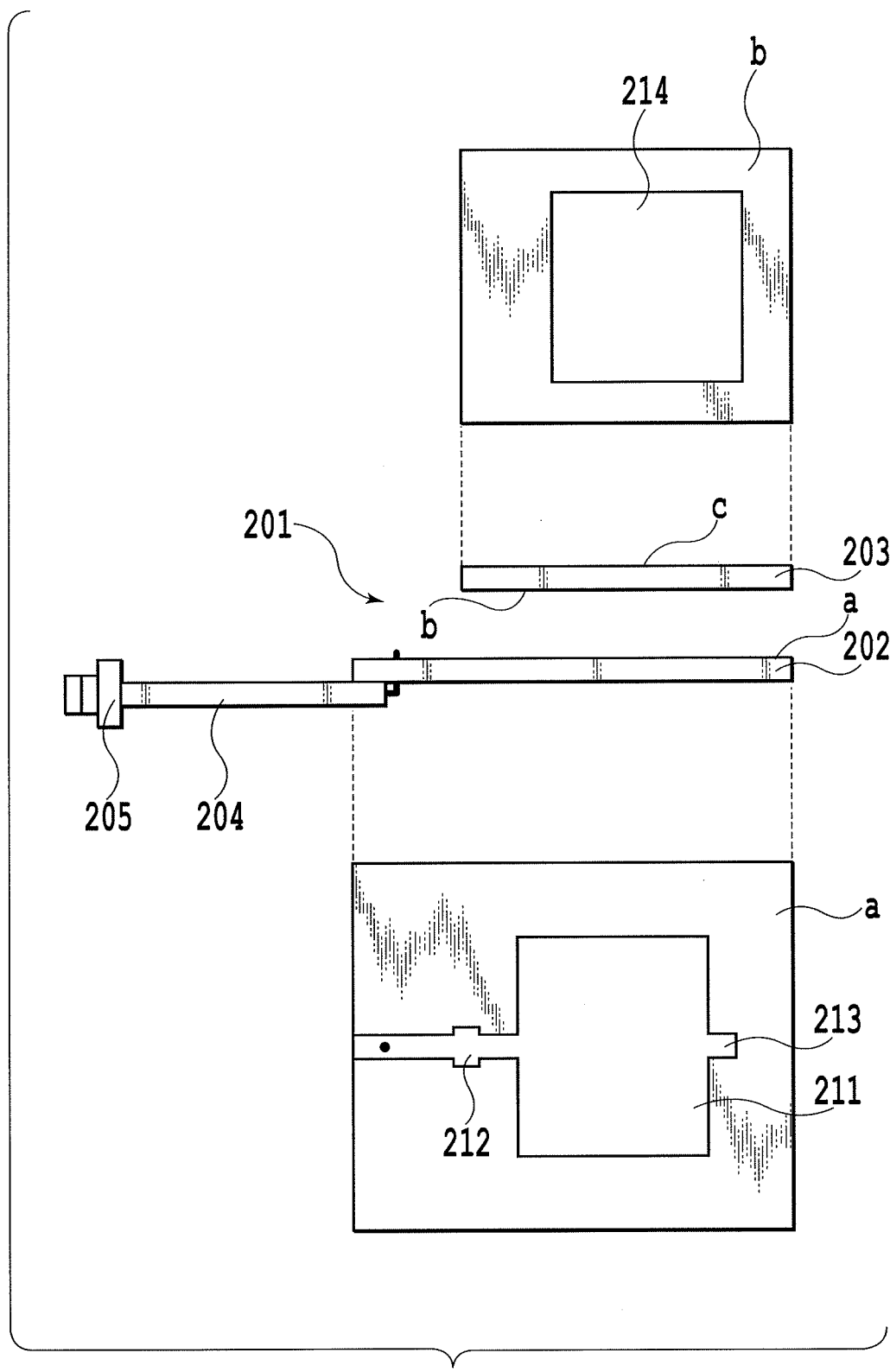
FIG. 21 is a diagram illustrating the structure of a planar antenna according to a fourth embodiment of the present invention.

FIG. 21 is a diagram showing the structure of a planar antenna according to the fourth embodiment. A planar antenna 201 includes a first substrate 202, where a pattern used as a patch antenna 211 is formed on a face a; a second substrate 203, where a pattern used as a non-feed patch 214 is formed on a face b; and a transmission line 204 that connects the patch antenna 211 to a connector 205. The patch antenna 211 and the transmission line 204 are connected together via a matching stub 212. A stub 213 is also formed at the position opposite the feeding portion of the patch antenna 211, and the planar antenna 201 obtains matching relative to a signal generator connected to the connector 205.

In the fourth embodiment, in the near field of the planar antenna 201 that has a low reflection coefficient (return loss), a small sample is arranged so as not to affect the return loss. Here, a coil type sample having an outer diameter of 3.6 mm and a length of 20 mm was prepared using an Fe wire, having a diameter of 0.2 mm, that was wound 20 times to form the loops of a coil.

Figure 22B:
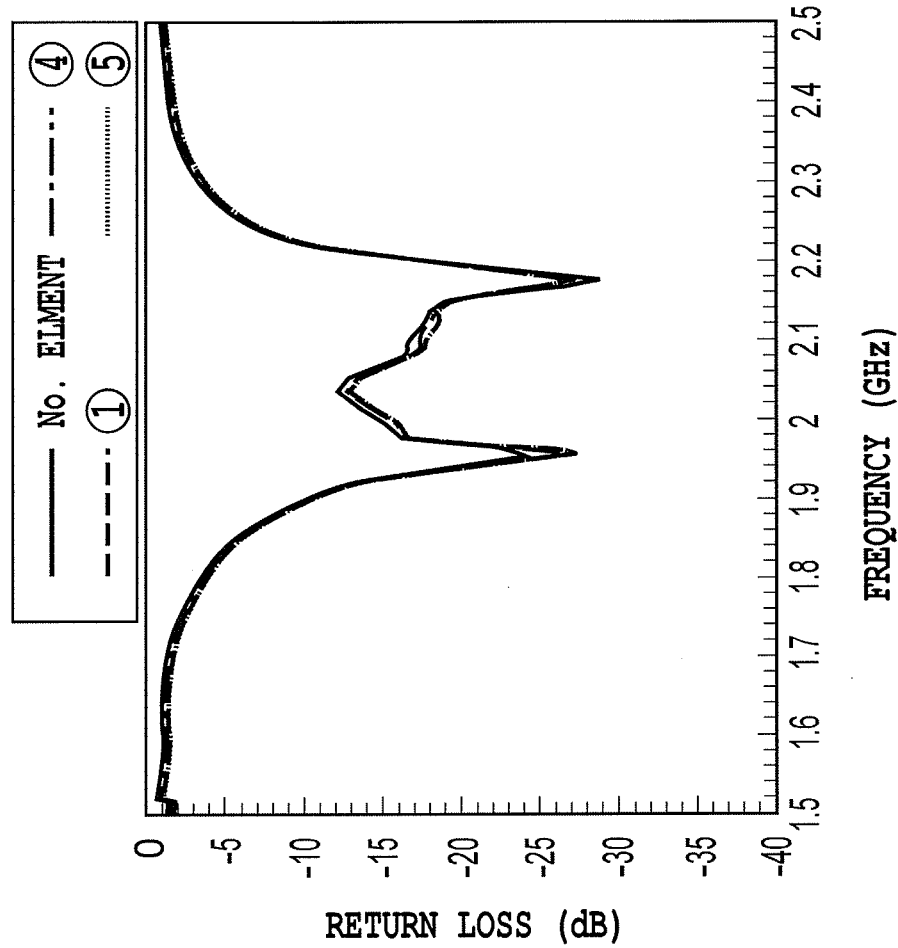
FIG. 22B is a diagram showing a relationship between the position of the coil type sample and the return loss for the planar antenna.
Figure 22A:
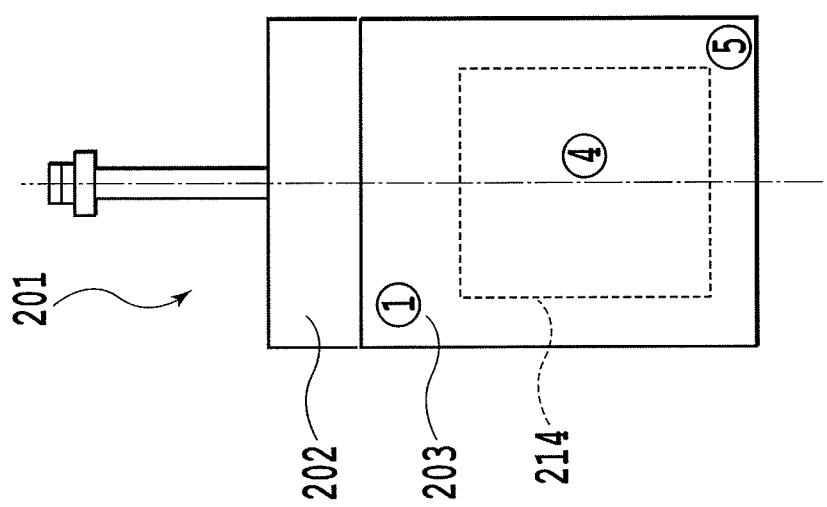
FIG. 22A is a diagram showing the position of a coil type sample on a planar antenna.

FIG. 22A is a diagram showing the position of the coil type sample on the planar antenna. The above described coil type sample was placed on a face c of the second substrate 203 of the planar antenna 201 in FIG. 21. FIG. 22B is a diagram showing the relationship between the position of the coil type sample and the return loss of the planar antenna. The return loss was measured while the coil type sample was placed at three positions shown in FIG. 22A. As is apparent from FIG. 22A, compared with a case wherein the coil type sample was not placed, the return loss is unchanged near the frequency of 2 GHz that is used for test signals.

Following this, in the near field of the planar antenna 201, test signals were emitted to the coil type sample that was a DUT. The coil sample was placed, as shown in FIG. 23A, on the face c of the second substrate 203 of the planar antenna 201 in FIG. 21. Measurements were performed while the coil sample was located at nine positions along the center line that runs across the feeding portion of the patch antenna 211. Test signals $f_1=2200$ MHz and $f_2=2050$ MHz were input, and a third-order PIM signal $f_3=1900$ MHz was observed.

Figure 23B:
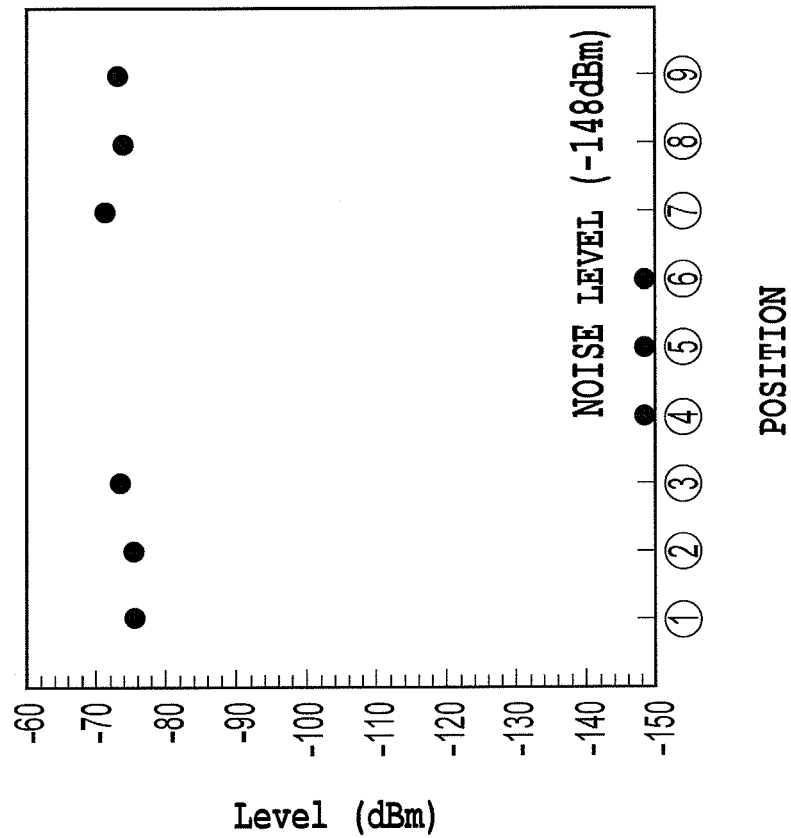
FIG. 23B is a diagram showing the PIM measurement results in accordance with the position of the coil type sample.
Figure 23A:
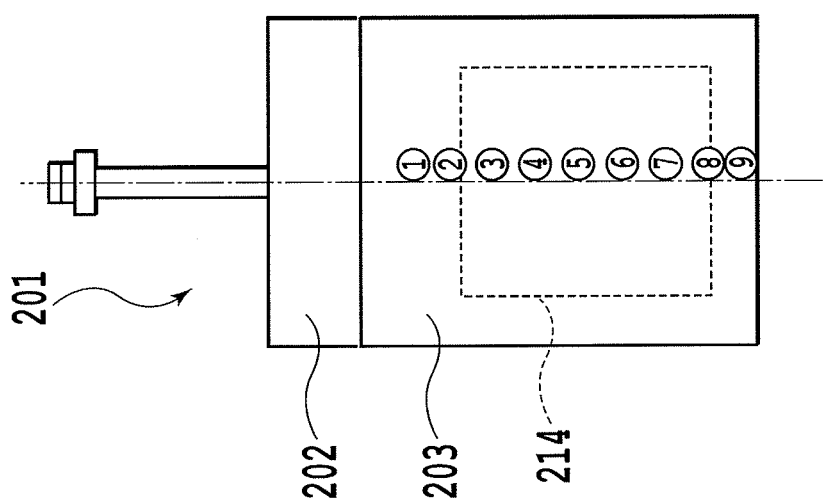
FIG. 23A is a diagram showing the position of a coil type sample on the planar antenna.

FIG. 23B is a diagram showing the PIM measurement results obtained in consonance with the position of the coil type sample. The PIM level in the center of the patch antenna 211 is extremely low, i.e., −150 dBm. On the other hand, a high PIM of 80 dBm or higher is observed in the vicinity of one side connected to the feeding portion and the vicinity of the opposite side. This is because, in the current distribution of the patch antenna 211, anti-nodes are formed along the two sides of the patch antenna 211, and nodes are formed in the center portion.

At this time, while the test signal level is 0 dBm (under a matching condition) at the feeding portion of the planar antenna 201, since the planar antenna 201 and the signal generators are in the matching condition, the property of the planar antenna 201 is not affected by the DUT, and PIM can be detected even when the output of the signal generators is low. Furthermore, since the PIM measurement level differs in accordance with the positional relationship of the planar antenna and the DUT, the position of the PIM generation source can be specified.

Figure 24:
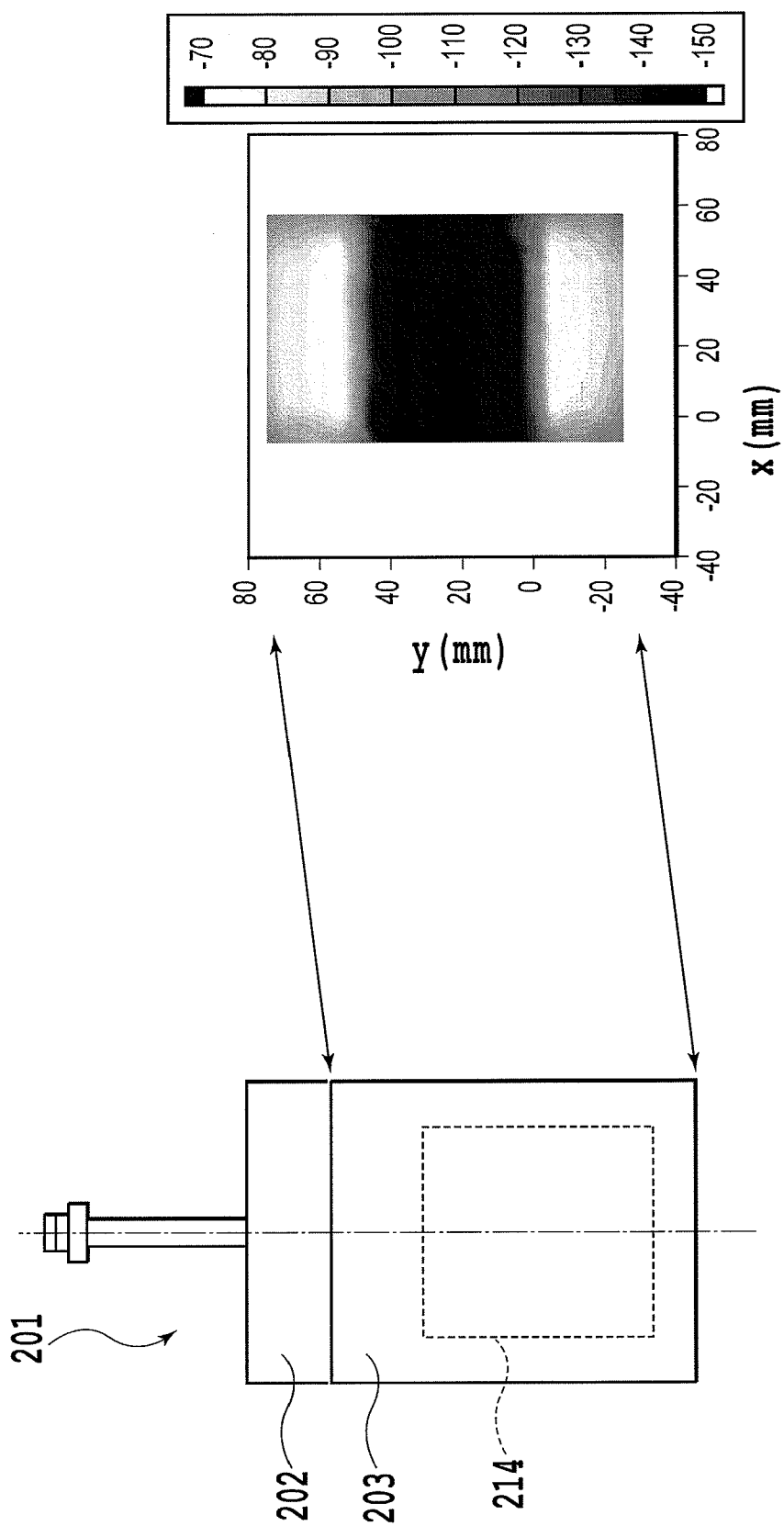
FIG. 24 is a diagram showing the distribution of the PIM level in consonance with the position of the coil type sample.

FIG. 24 shows a distribution of the IM level in accordance with the position of the coil type sample. The method shown in FIGS. 23A and 23B was employed to measure a distribution on the face c of the second substrate 203 of the planar antenna 201 in FIG. 21. As described above, the change in the PIM level consonant with the current distribution of the patch antenna is easily understood.

According to the fourth embodiment, when a small sample that does not affect the property of an antenna is employed for the near field of the antenna, PIM can be detected in the non-contact state relative to the DUT. Furthermore, since the antenna is in the matching condition, the PIM detection can be efficiently performed using low electric power.

Next, the distance dependency of the planar antenna and the DUT will now be described. The position of a coil type sample on the planar antenna 201 is shown in FIG. 25A. In the PIM level distribution in FIG. 24, two positions where the PIM level is high and one position where the PIM level is low were selected, and a coil type sample was positioned on the face c of the second substrate 203. At the individual positions, PIM was measured by changing the height from the face c. Test signals $f_1=2200$ MHz and $f_2=2050$ MHz were input and a third-order PIM signal $f_3=1900$ MHz was observed. The test signal level was 0 dBm (under a matching condition) at the feeding portion for the planar antenna 201.

Figure 25B:
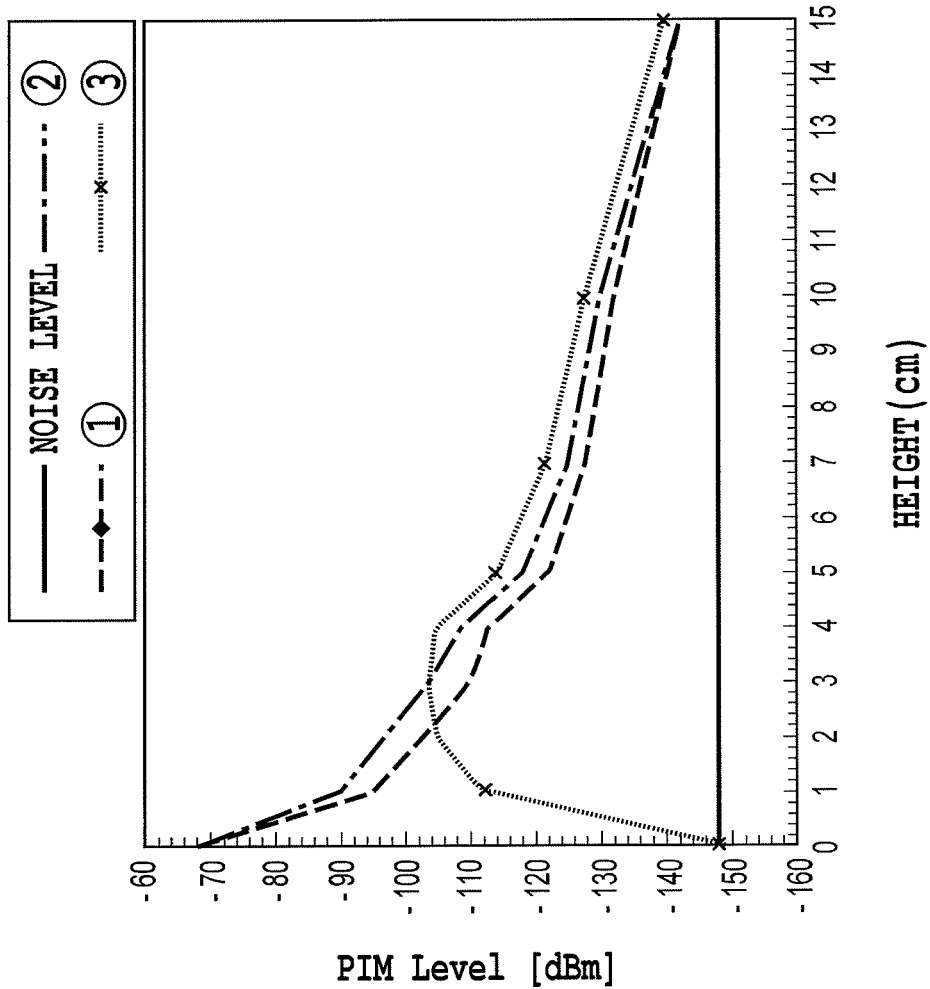
FIG. 25B is a diagram showing the PIM measurement results consonant with the height of the coil type sample.
Figure 25A:
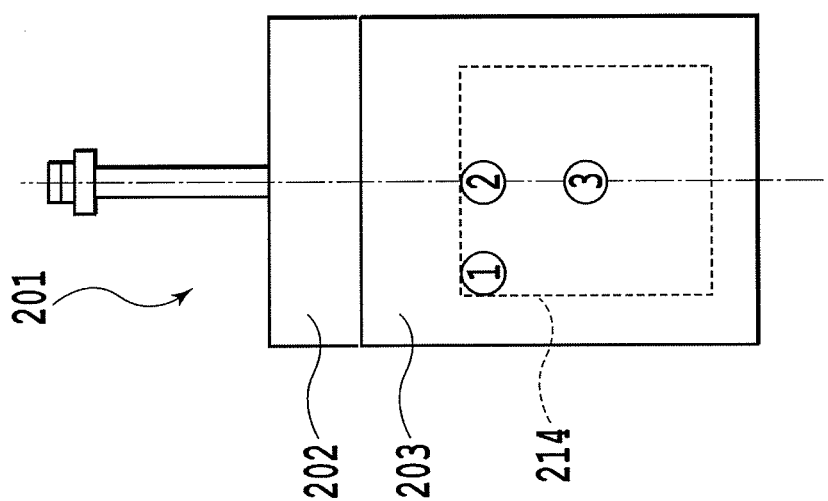
FIG. 25A is a diagram showing the position of the coil type sample on the planar antenna.

FIG. 25B is a diagram showing the PIM measurement results obtained in consonance with the height of the coil type sample. It is apparent that, since in the area at the height of 1 cm or less, the PIM measurement level differs depending on the position of the coil type sample on the face c of the planar antenna, the position of the PIM generation source can be specified in the near field. On the other hand, beginning at a height of around 2 cm, the PIM measurement levels become almost equal, regardless of the position of the coil type sample on the face c of the planar antenna. That is, in the case of the planar antenna, the height of 2 cm or greater can be called a far field by the meaning used for this specification.

As is apparent from FIG. 25B, since a definite difference in the PIM measurement level is also present in the far field, in accordance with the distance between the coil type sample and the planar antenna, the presence/absence of the PIM generation source can be detected. Therefore, instead of employing the DUT to detect a connection failure portion, as in the above described embodiments, a sample that includes a connection failure portion can be employed in a positive manner to detect the presence/absence of the sample.

For example, whether an object to which a T-shaped sample used for the third embodiment is attached has been passed through the far field of the planar antenna can be detected.

INDUSTRIAL APPLICABILITY

The present invention can be employed for the measurement of electric and magnetic characteristics for materials, including electric materials and magnetic materials. Further, the present invention can be employed for an apparatus for measuring characteristics of these materials. Furthermore, the present invention can be used for a manufacturing inspection equipment, such as for the detection of a connection failure or a performance failure in an electronic component.

The invention claimed is:

1. A system for measuring a passive intermodulation signal, which is generated by a device under test in a high frequency band, comprising:
   a plurality of signal generation means for generating a plurality of test signals, each having different frequencies;
   signal separation means including a first terminal, used to input the plurality of test signals from the plurality of signal generation means, a second terminal, used to output the plurality of test signals received at the first terminal and to input the passive intermodulation signal, and a third terminal used to output only the passive intermodulation signal;
   a transmission line having two conductors, one end of which is connected to the second terminal of the signal separation means, and which provides an impedance mismatching condition between a device under test and the transmission line, and generates a standing wave of the plurality of test signals along the transmission line, while the device under test is located between the two conductors along the transmission line where the standing wave is generated, and at the other end of the transmission line; and
   passive intermodulation measurement means connected to the third terminal of the signal separation means to measure the passive intermodulation signal,
   wherein the other end of the transmission line is short-circuited by using the device under test; and passive intermodulation of the device under test, which is generated at a position of an anti-node of a current standing wave of the plurality of test signals is measured.

2. The measurement system according to claim 1, wherein both ends of the device under test are connected, by welding, to the two conductors of the transmission line.

3. The measurement system according to claim 1, wherein at least one of the ends of the device under test is connected using an electric contact point, and the other end is connected by welding.

4. The measurement system according to claim 1, wherein a line length of the transmission line is set so that when the other end of the transmission line is open, the maximum passive intermodulation is measured.

5. A system for measuring a passive intermodulation signal, which is generated by a device under test in a high frequency band, comprising:
   a plurality of signal generation means for generating a plurality of test signals, each having different frequencies;
   signal separation means including a first terminal, used to input the plurality of test signals from the plurality of signal generation means, a second terminal, used to output the plurality of test signals received at the first terminal and to input the passive intermodulation signal, and a third terminal used to output only the passive intermodulation signal;
   a transmission line having two conductors, one end of which is connected to the second terminal of the signal separation means, and which provides an impedance mismatching condition between a device under test and the transmission line, and generates a standing wave of the plurality of test signals along the transmission line, while the device under test is located between the two conductors along the transmission line where the standing wave is generated, and
   passive intermodulation measurement means connected to the third terminal of the signal separation means to measure the passive intermodulation signal,
   wherein the transmission line is a hollow transmission line, and the other end of the transmission line is open; and the device under test is arranged at the position of the anti-node of a current standing wave or a voltage standing wave in the hollow transmission line to measure passive intermodulation.

6. A method for measuring a passive intermodulation signal, which is generated by a device under test in a high frequency band, comprising the steps of:
   generating, in a high frequency band, a plurality of test signals, each having different frequencies;
   providing an impedance mismatching condition between a device under test and a transmission line to which the plurality of test signals are input, and generating a standing wave of the plurality of test signals along the transmission line; and
   measuring the passive intermodulation signal,
   the method further comprising,
   before the method is used, adjusting a length of the transmission line is performed so as to maximize a passive intermodulation signal level that is to be measured in the state wherein the device under test is not connected,
   wherein the step of generating a standing wave includes short-circuiting the tip of the transmission line by the device under test.

* * * * *